(12) United States Patent
Mehraeen et al.

(10) Patent No.: US 12,132,303 B2
(45) Date of Patent: Oct. 29, 2024

(54) DC CIRCUIT BREAKER WITH AN ALTERNATING COMMUTATING CIRCUIT

(71) Applicant: Board of Supervisors of Louisiana State University and Agricultural and Mechanical College, Baton Rouge, LA (US)

(72) Inventors: Shahab Mehraeen, Baton Rouge, LA (US); Sudipta Sen, Baton Rouge, LA (US)

(73) Assignee: BOARD OF SUPERVISORS OF LOUISIANA STATE UNIVERSITY AND AGRICULTURAL AND MECHANICAL COLLEGE, Baton Rouge, LA (US)

( * ) Notice: Subject to any disclaimer, the term of this patent is extended or adjusted under 35 U.S.C. 154(b) by 0 days.

(21) Appl. No.: 18/110,509

(22) Filed: Feb. 16, 2023

(65) Prior Publication Data

US 2023/0275417 A1    Aug. 31, 2023

Related U.S. Application Data

(62) Division of application No. 16/586,405, filed on Sep. 27, 2019, now Pat. No. 11,611,207.

(Continued)

(51) Int. Cl.
*H02H 3/087*      (2006.01)
*G01R 31/327*     (2006.01)
(Continued)

(52) U.S. Cl.
CPC ......... *H02H 3/087* (2013.01); *G01R 31/3272* (2013.01); *H01H 9/54* (2013.01);
(Continued)

(58) Field of Classification Search
CPC ........ H02H 3/087; H02H 1/063; H02H 3/021; H02H 9/02; G01R 31/3272; H01H 9/54;
(Continued)

(56) References Cited

FOREIGN PATENT DOCUMENTS

EP    2495745 A1 * 9/2012 ........... H01F 38/023
JP    2004014241 A * 1/2004
(Continued)

OTHER PUBLICATIONS

X. Pei, O. Cwikowski, D. S. Vilchis-Rodriguez, M. Barnes, A. C. Smith and R. Shuttleworth, "A review of technologies for MVDC circuit breakers," IECON 2016—42nd Annual Conference of the IEEE Industrial Electronics Society, 2016, pp. 3799-3805, doi: 10.1109/IECON.2016.7793492 (Year: 2016).*

*Primary Examiner* — Thienvu V Tran
*Assistant Examiner* — Sreeya Sreevatsa
(74) *Attorney, Agent, or Firm* — Thomas | Horstemeyer, LLP

(57) ABSTRACT

The present disclosure provides a DC mechanical circuit breaker that can utilize two switches, one of which can generate zero-crossing with an alternate oscillatory circuit for the other one, which can be a conventional zero-crossing-based AC breaker and can be used in the main circuit. This is different from the conventional single-switch commute-and-absorb method currently used. The present disclosure shows that disclosed circuit breaker improves the fault current extinction and significantly reduces the voltage rate-of-change while creating the current zero-crossing faster compared to the available technology. Thus, disclosed circuit breaker is capable of interrupting high DC currents with minimal arc through a less expensive AC circuit breaker. Simulation and hardware results are provided to show the efficiency of the disclosed circuit breaker.

16 Claims, 24 Drawing Sheets

Related U.S. Application Data

(60) Provisional application No. 62/737,796, filed on Sep. 27, 2018.

(51) Int. Cl.
| | |
|---|---|
| *H01H 9/54* | (2006.01) |
| *H01H 33/59* | (2006.01) |
| *H02H 1/06* | (2006.01) |
| *H02H 3/02* | (2006.01) |
| *H02H 9/02* | (2006.01) |
| *H03K 17/13* | (2006.01) |

(52) U.S. Cl.
CPC .......... *H01H 33/596* (2013.01); *H02H 1/063* (2013.01); *H02H 3/021* (2013.01); *H02H 9/02* (2013.01); *H03K 17/13* (2013.01)

(58) Field of Classification Search
CPC .. H01H 33/596; H01H 2009/543; H01H 9/56; H03K 17/13; H03K 17/136; H03K 17/16
USPC ............................................................ 361/1
See application file for complete search history.

(56) References Cited

FOREIGN PATENT DOCUMENTS

| WO | WO-2012100831 A1 | * | 8/2012 | ............. H01H 9/542 |
| WO | WO-2019234401 A1 | * | 12/2019 | ........... H01H 33/596 |

* cited by examiner

Table I Summary of test results

| Case | Cap (µF) | Rest. Res (Ω) | V | I$_o$ | Type | T$_f$ Meas; Sim (µs) | Condition |
|---|---|---|---|---|---|---|---|
| 2 | 1000 | 0.5 | 35 | 35 | Mech | | Disrupt with arc |
| 4 | No cap | | 40 | 40 | Mech | | Continuous arc |
| 5 | 1000 | 0.05 | 42.75 | 40.74 | Mech | 4.8; 5.0 | No visible arc |
| 11 | 500 | 0.5 | 50.73 | 24.85 | Mech | | Continuous arc |
| 12 | 500 | 0.05 | 53.7 | 50.9 | Mech | 3.2; 3.5 | No visible arc |
| 13 | 209 | 0.05 | 53 | 50.43 | Mech | | Continuous arc |
| 15 | 500 | 0.05 | 83 | 43.05 | Mech | 4.4; 3.6 | No visible arc |
| 16 | 209 | 0.05 | 88 | 42.7 | Mech | | Continuous arc |
| 17 | 162 | 0.05 | 88 | 43.04 | Hybrid | 2.1; 2.0 | No visible arc |

FIG. 18

DC CIRCUIT BREAKER WITH AN ALTERNATING COMMUTATING CIRCUIT

CROSS REFERENCE TO RELATED APPLICATIONS

This application claims priority to U.S. provisional application entitled "DC CIRCUIT BREAKER WITH AN ALTERNATE COMMUTATING CIRCUIT" having Ser. No. 62/737,796, filed Sep. 27, 2018, the entirety of which is hereby incorporated by reference.

STATEMENT REGARDING FEDERALLY SPONSORED RESEARCH OR DEVELOPMENT

This invention is made with government support under Grant No. NSF ECCS-1151141 awarded by the National Science Foundation (NSF), Division of Electrical, Communications and Cyber Systems (ECCS). The U.S. Government has certain rights in the invention.

BACKGROUND

DC electric power has attracted great attention in the last decades and demanded a great deal of research. High-voltage DC (HVDC) lines have been around for several years and are very cost-effective in transmission circuits. In addition, the recent technical accomplishments serving ideas such as microgrids and smart grids that use DC-based renewable energy and distributed energy resources (DERs) have added more versatility to the conventional power grids. Many of the available DERs exploit DC power from various types of energy sources and require conversion to AC power using additional equipment including inverters. This, in turn, has led to the reconsideration of DC networks in medium and low-voltage circuits. Despite the advantages of DC grids over their AC counterparts, protection of DC circuits in both micro grids and HVDC transmission lines has remained challenging.

Research and development in DC power systems originate from the 1970s when DC electric power was mostly used in limited low voltage applications. Traditionally, AC lines are used in medium and high-voltage transmission and distribution systems. Development of low-loss and high-frequency semiconductor devices led towards advanced power converters such as multi-terminal direct current (MTDC) systems. Such converters make it easier to convert power from different types of generation such as wind farms, solar panels, tidal waves generators, etc. For long distance deployments, high voltage AC (HVAC) transmission lines are more expensive compared to HVDC systems. Besides, connecting different power grids or components with a different voltage or frequency specification using DC lines provides more control on power flow and direction benefiting the power market and the grid stability. It is even simpler and more efficient when DC microgrids integrate multiple sources (including batteries and renewables) in low-voltage levels, which eliminates the need to incorporate energy conversion and complex control methods.

Current interruption in DC circuits, however, is more challenging than in their AC counterparts. This is because the absence of natural current zero-crossing and resistive nature of the DC grids creates a significantly higher fault current to disrupt at the DC circuit breakers. Available approaches to break DC fault currents include creating forced zero-crossing current at the breaker and employing solid-state circuit breakers.

SUMMARY

Embodiments of the present disclosure are related to a direct current (DC) circuit breaker for creating a forced zero-crossing current. The DC circuit breaker can include an alternating current (AC) circuit breaker, a mechanical switch, and a parallel capacitor. The mechanical switch can comprise a first terminal and a second terminal. The parallel capacitor can connect the first terminal and the second terminal of the mechanical switch. The first terminal of the mechanical switch can connect to the AC circuit breaker.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 18 illustrates an example of a table summarizing the results of tests for evaluating the performance of the disclosed DC mechanical circuit breaker and DC hybrid circuit breaker, in accordance with various embodiments of the present disclosure.

DETAILED DESCRIPTION

Figure 1A:
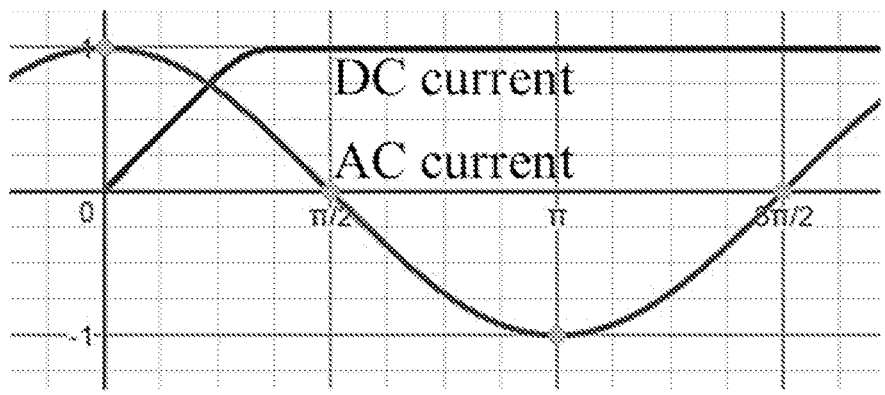
FIGS. 1A and 1B illustrates an example of currents in AC and DC circuits, in accordance with various embodiments of the present disclosure.

Disclosed herein are various embodiments of methods related to a DC circuit breaker with an alternating commutating circuit. The present disclosure summarizes the current DC breaker technologies and proposes new alternate methods of DC circuit breaking. The disclosed apparatus is a mechanical circuit breaker that can use two switches. One switch can be a mechanical switch that can generate a current zero-crossing with an alternate oscillatory circuit for the other switch. The other switch can be a conventional zero-crossing-based AC breaker that can be used in the main circuit. This is different from the conventional single-switch commute-and-absorb method. It is shown that, compared to available technology, the oscillatory circuit of the disclosed circuit breaker improves the fault current extinction and significantly reduces the voltage slew rate of conventional mechanical and solid-state switches while creating the current zero-crossing faster. Thus, the disclosed circuit breaker is capable of interrupting high DC currents with a minimal arc through a less expensive AC circuit breaker. Simulation and hardware results are provided to show the efficiency of the disclosed circuit breaker. Reference will now be made in detail to the description of the embodiments as illustrated in the drawings, wherein like reference numbers indicate like parts throughout the several views.

DC circuit breakers, as their name suggests, are used to protect electrical equipment that operates on direct current. DC breakers are frequently used in applications like, for example, HVDC circuits and DC distribution systems, electric vehicle charging stations, direct current drives, electric arc welding machines, LED lamps, Uninterruptible Power Supplies (UPSs) that use batteries to store DC energy, electrical components in gas and electrical vehicles like fuse boxes, PV solar panel installations, and electrical circuits that use batteries as a power source like homes with solar panels and rural homes without electrical grid connectivity.

One of the main challenges in operating DC grids is the switching and current interruption for system safety and protection. Developing DC circuit breakers (DCCB) is difficult for two main reasons. First, DC grids have lower line impedances compared to AC systems, which causes the short-circuit current rise to be substantially faster and at higher values. Hence, a DCCB needs to interrupt the fault current faster than an AC breaker to prevent danger to lives and damage to the components. Early developments in DC breakers made possible breaker operating times in the range of dozens and even hundreds of milliseconds. By contrast, recent developments in MTDC systems demand breaker operating times of less than a few milliseconds.

Figure 1B:
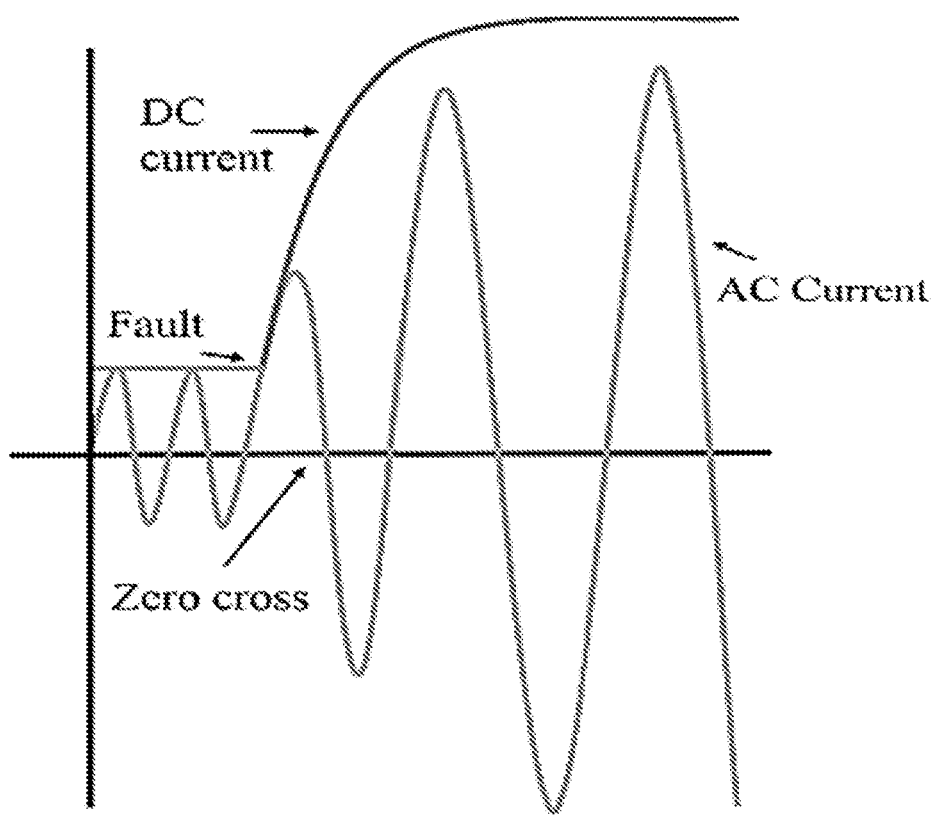

Second, unlike in the sinusoidal alternating currents, DC circuits lack a natural current zero-crossing, as shown in FIGS. 1A and 1B. In AC lines, the natural zero-crossing is the key component for fast-acting breakers where vacuum or SF6 dielectric environment are exploited to extinguish the arc. Therefore, one major strategy for DCCB operation is to artificially create a zero current so that a form of switch can interrupt the current and extinguish the arc. The current zero-crossing is typically achieved through an auxiliary circuit so that the high DC current can be re-routed and thus the DC breaker can operate under zero current.

Another method of breaking the high DC current is using semiconductor breakers. These breakers increase the current path impedance once they are triggered and so no arc is developed. However, this type of breaker generates a significantly high voltage rate-of-change and bears a high steady-state resistance that is not desirable.

Several factors are considered in selecting DC breakers. Maximum interrupting current and the operating speed are two key characteristics that are significantly more stringent to meet. The DCCB design should be capable of dissipating a large amount of energy stored in the line inductances during fault clearance. The breaker conducting resistance and steady-state loss is also an important factor. Typically, 30% of losses in voltage-source converter stations, where solid-state devices are used to break the current, are due to DCCBs steady-state losses. On the other hand, situations such as remote off-shore wind farms and desert-located solar panels have made the breaker's physical specifications, such as weight and space, more important. In addition, DCCB breakers should be able to withstand multiple restrikes in case of resistive loads.

DC circuit breakers fall into three main types: mechanical switches (MS), static or solid-state DC circuit breakers (SDCCB), and hybrid breakers. The original designs for DC breakers were limited to simple mechanical switches. In HVDC systems, the switch is equipped with strong dielectric for extinguishing the arc and/or with parallel branches to enforce the current zero-crossing and absorb the energy. But despite research and developments in DC circuit breakers, mechanical circuit breakers are still commonly used.

Figure 2:
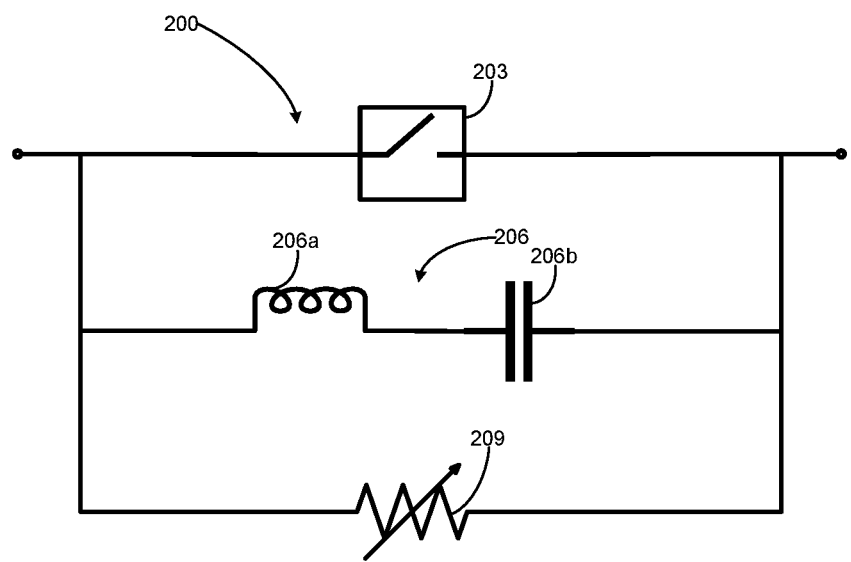
FIG. 2 illustrates an example of a convention mechanical DC circuit breaker.

Turning to FIG. 2, shown is an example of a conventional mechanical DCCB. The conventional mechanical DCCB 200 comprises three parallel branches: a steady state primary switch (current-carrying commutation switch) 203, a forced zero-crossing commutation circuit (oscillatory circuit) 206, and an energy absorber branch (nonlinear resistor) 209.

The primary switch (commutation switch) 203 is the main element of most mechanical DCCBs 200. After a fault is detected, the primary switch 203 attempts to break the circuit. As the switch 203 starts to open, the fault current is partially diverted to the commutation circuit 206 to initiate resonance in an LC oscillatory circuit 206, which is designed to create an artificial current zero-crossing in the primary switch 203.

Two types of commutation circuits 206 are used in mechanical circuit breakers: passive and active. Active commutation circuits can use active elements such as auxiliary switches and semiconductor switches that act in specific times and are coordinated with the primary switch 203. Passive commutation circuits, on the other hand, comprise passive elements such as inductors and capacitances in an oscillatory circuit to create a resonant circuit as explained earlier.

The exemplary mechanical DC circuit breaker 200 of FIG. 2 uses a passive commutation circuit. The oscillatory circuit (commutation circuit) 206 is usually used in medium voltage applications and consists of an inductor 206a and a capacitor 206b in series. By appropriately choosing the LC parameters in the passive commutating circuit 206, an oscillating current greater than the main DC current can be created leading to a close-to-zero primary switch current. After the occurrence of zero current in the mechanical breaker 200 and successful termination of arc in the primary switch 203, current continues to flow through oscillatory circuit 206, thereby charging the capacitor 206b.

The energy dissipation branch 206 usually takes advantage of the surge arrester technologies by using nonlinear resistance such as metal-oxide varistors (MOV). If the voltage of the capacitor 206b crosses the threshold value of the variable resistor (or surge arrestor) 209, the energy release path acts and dissipates the energy of the oscillatory circuit 206 in the nonlinear resistor 209. Therefore, the stored energy in the faulty circuit that includes that of the power lines inductances releases and fault current disruption is complete.

Figure 3:
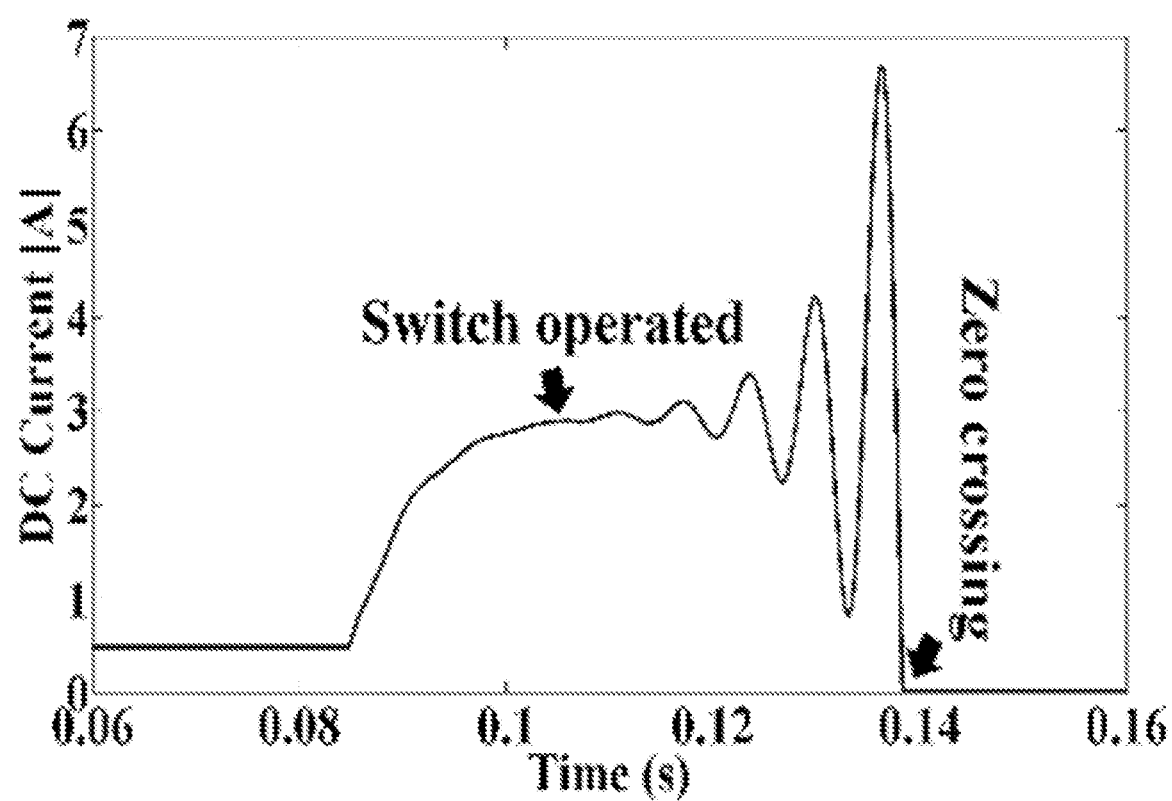
FIG. 3 illustrates an example of the creation of an artificial current zero-crossing in the conventional mechanical DC circuit breaker of FIG. 2, in accordance with various embodiments of the present disclosure.

FIG. 3 depicts an example of artificially-created current zero-crossing in a conventional mechanical DC circuit breaker like the one illustrated in FIG. 2. When current zero-crossing occurs, the current through the primary switch 203 reaches zero, and fault current is carried by the oscillatory circuit 206, extinguishing the initial arc. Without diverting the current, the ionized air created by the initial arc makes a conductive current path and fault current continues to flow despite an open switch 203. Once opening the switch 203 is complete, an energy absorber branch 209 creates a short path in case of excessive voltage on the parallel oscillatory branch 206 and dissipates the energy stored in the circuit.

Conventional mechanical DC circuit breakers 400 have low cost and losses. However, due to wear and tear of the mechanical contacts, the number of high current clearances is limited. And due to their relatively slow response times (30-40 ms) and low current breaking capacity (less than 4 kA) they should be accompanied by other protective mechanisms especially when they are to be used in VSC-MTDC, substations. In addition, current zero-crossing (through commutating circuits) is not conventional in low-voltage applications due to the costs involved in employing an additional inductor. The disclosed mechanism, however, significantly improves the low-voltage technology.

Figure 4:
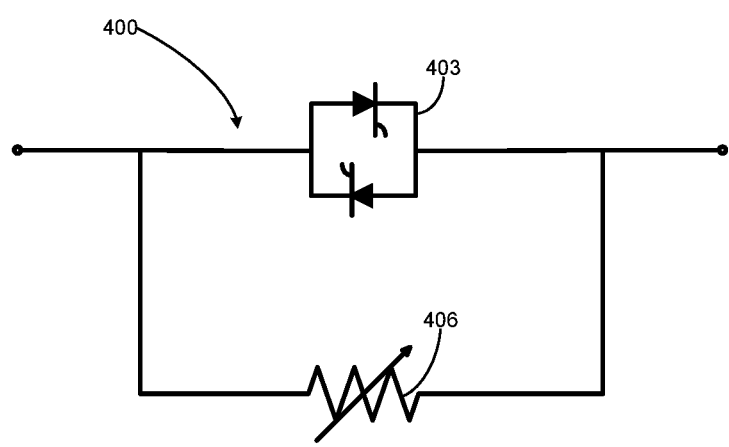
FIG. 4 illustrates an example of a conventional solid-state DC circuit breaker, in accordance with various embodiments of the present disclosure.

Turning to FIG. 4, shown is an example of a solid-state (static) switch 403 used in a DCCB 400 to force the current to zero, mitigate the arc (if there is any), and break the circuit through a rapid increase in the path impedance. In solid-state DC circuit breakers (SDCCB) 400, the mechanical switch is replaced with a static semiconductor switch 403. Solid-state circuit breakers 400 are capable of very fast switching and can consequently break a circuit in a few micro seconds. Unlike the conventional mechanical DC circuit breaker 200, there is no oscillatory circuit or commutation path in the SDCCB 400. This type of DCCB is applicable in medium voltage lines where they can have a maximum interruption capacity of 5 kA. A series string of semiconductor devices such as SiC based IGBT, IGCT, GTO, GCT, etc., may be used for higher voltages due to their lower conduction losses [13]-[15].

In normal operation of the circuit, the static switch 403 carries the circuit nominal current. When fault is detected, a control signal is sent to the semiconductor gate 403 to initiate the breaker operation and current disruption. As the semiconductor 403 turns off, high blocking voltage appears across the breaker terminals due to a rapid change in the circuit current and the presence of inductive elements. Subsequently, the energy stored in line inductances during the fault is discharged in the variable resistor or surge arrester 406 once the high voltage across the switch 403 triggers the nonlinear resistor 406.

However, one disadvantage of SDCCBs 400 the high blocking voltage across the breaker terminals increases the voltage ratings of the other circuit components compared to other methods. Another disadvantage of SDCCBs 400 is that the normal operating current flows through the solid-state switch 403 causing significant steady-state loss that can be up to 30% of losses in VSC-MTDC stations, unlike the mechanical breakers 200. Also, static breakers 400 increase the voltage ratings of the other circuit components compared to other methods due to rapid current blocking.

Figure 5:
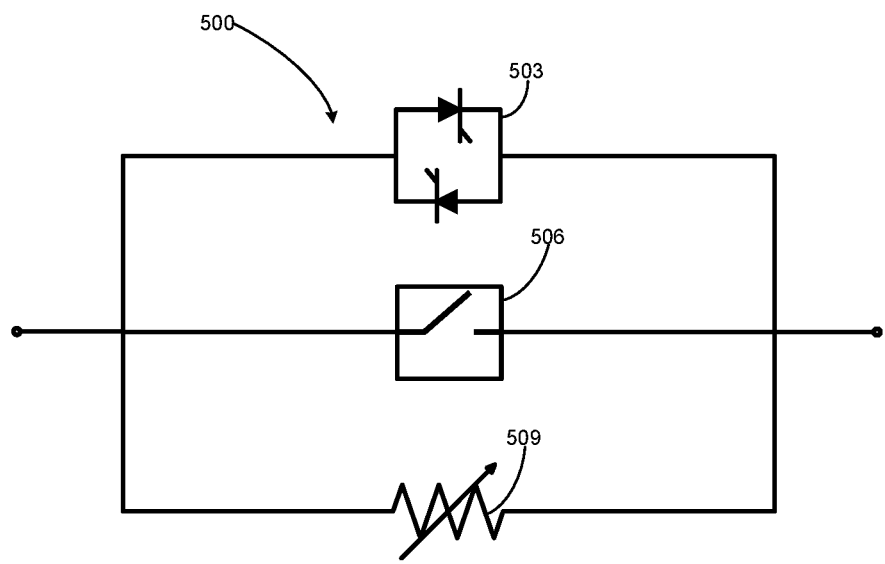
FIG. 5 illustrates an example of a conventional hybrid DC circuit breaker, in accordance with various embodiments of the present disclosure.

Turning to FIG. 5, shown is the schematic diagram of a conventional hybrid DC circuit breaker. Hybrid DC circuit breakers 500 combine mechanical circuit breakers 200 and solid-state circuit breakers 400 aiming to take advantage of both schemes. During normal operation, the mechanical switch 506 conducts the current and the static switch 503 is turned off eliminating high power loss due to the switch resistance. Once the fault is detected, the mechanical switch 506 starts to open and a control signal is simultaneously given to the static switch 503. Gradually, the voltage across the contacts of the mechanical switch 506 rises to a high value enough to commute the current to the static switch 503. The current in the mechanical part 506 starts to decline and in the static part 503 starts to increase. As the transfer of the current from the mechanical switch 506 to the static switch 503 completes, the mechanical switch 506 contacts can separate almost with no arc. Then, a turn off signal is sent to the static switch 503 to terminate the current like SDCCB operation. Next, as the line inductance energy starts to discharge, the breaker voltage rises very quickly and the energy absorber branch 509 dissipates the resultant energy.

As discussed earlier, hybrid circuit breakers 500 have very low power losses in normal operation, high reliability, and long operating life span, and there is no need for a natural zero-crossing to turn off the DC current. But since the mechanical switch 506 has the lowest switching speed, the overall mechanism switching time depends on the mechanical switch 506. In some designs, a low voltage static switch is used as auxiliary breaker in series with mechanical switch 506 to assure and speed up the load commutation switching (LCS) by reducing delay time between commutation of current and semiconductor turn off. The latter increases the mechanism's reliability and speed at the cost of increasing power losses to tens of kilowatts, requiring cooling systems, and increasing the complexity. Nevertheless, the rapid voltage rise still exists when the solid-state device 503 breaks the current, thereby mandating higher voltage ratings for the other circuit components.

Figure 6:
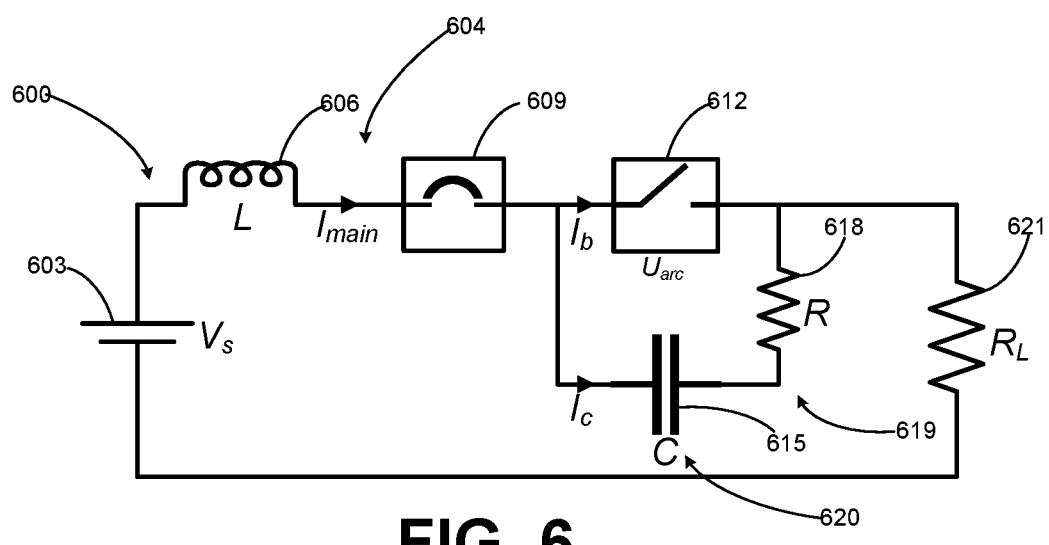
FIG. 6 illustrates an example of a DC mechanical circuit breaker with an alternating commutating circuit, in accordance with various embodiments of the present disclosure.

Turning to FIG. 6, the DC circuit breaker with an alternating commutating circuit 600 will now be described. The circuit breaker 600 can comprise three components: a fast mechanical (primary) switch 612, a parallel capacitor branch 619, and a conventional AC circuit breaker (secondary breaker) 609.

In some embodiments, current can flow through the mechanical switch during normal operation, before interruption is commanded. Once the fault is detected in the DC line and the interruption command is issued, the primary mechanical switch 612 can initiate separation of the contacts. This separation results in the current commutating into the capacitor 615 parallel to the switch 612. Then, one of at least two possible scenarios can occur.

First, at lower DC voltages or currents when a larger capacitor is used, the capacitor 615 can remain short circuit for some time. This can reduce the current flowing through the mechanical breaker 612. In addition, it can prevent the rapid rise of voltage across the contacts, thereby mitigating the high rate of change of voltage. This can enable the mechanical switch 612 to separate the contacts without significant arc, allowing higher ratings and longer lifetime of the breaker contacts.

In particular, the primary switch 612 can employ an RC auxiliary circuit 619 that can redirect the switch current rapidly and let the switch 612 to open with minimal arc. This eliminates the need for an inductor in the commutation circuit 619. Next, by the help of DC line's smoothing reactor, current zero-crossing can be created across the secondary switch 606—which is a conventional AC circuit breaker—causing the secondary switch 606 to trip.

Second, at higher voltages or currents or when a smaller capacitor is utilized arc is established between the primary switch 612 contacts. The voltage across the arc initiates an oscillatory current in the parallel LC branch 620 comprised of the parallel capacitor 615 and its parasitic inductor. Thus, a current zero-crossing can then occur at the primary switch 612. Once this occurs, the commutation is completed and the current goes through the capacitor 615. The parallel capacitor 615 helps in commutating the current by reducing the current in mechanical breaker 612 and can prevent the rapid rise of voltage across the contacts and mitigate a high rate of change of voltage, as discussed above. The DC line inductance helps with the operation of the DC mechanical breaker 600 in creating current oscillation and zero-crossing. Proper selection of the capacitor size in accordance with the line inductance results in resonance with appropriate frequency and rapid fault disruption. Additional series inductors can be added if necessary. The capacitor 615 and the series power line inductance constitute an LC oscillatory circuit 620, which can then force a current zero-crossing in the main circuit 604 by causing a rapid fault current decay in the main circuit 604. This can lead to another current zero-crossing, this time at the secondary circuit breaker 609. The AC breaker 609 can operate once the currently zero-crossing is reached, disrupting the fault current. Once the fault current is disrupted, the primary switch 612 can be closed to discharge the capacitor 615.

In conventional mechanical DC breakers 200, the current zero-crossing is generated across the primary mechanical switch 203 with the help of a dedicated LC circuit 206. In low-voltage applications, however, a simpler commutating circuit using an RC circuit can be used. This process can increase the oscillatory current in the LC circuit 620, while the air gap, and thus voltage across the primary switch 612, can increase until the oscillatory current exceeds the main current. This can extinguish the arc by leaving no current through the primary switch 612. Thus, the mechanism of the disclosed mechanical DC circuit breaker 600 can improve the rating of the switch 612 without having to modify the switch contacts and actuator.

The DC mechanical breaker 600 has several other advantages over the conventional DC circuit breakers 200, 400, 500. For example, the voltage rate-of-change can also be maintained at low levels compared to both available mechanical and solid-state switches.

As another example, current oscillation can be created with the help of the entire DC circuit, which leads to faster creation of current zero-crossing than in conventional mechanical tripping methods. This can mean less harm to the circuit. Faster current zero-crossing can also allow the DC mechanical circuit breaker 600 to use a less expensive primary switch 612, together with a secondary switch 609 that can simply be a conventional AC switch, which can lead to lower cost. And because the main circuit current can be interrupted using a conventional zero-crossing AC breaker 609, the disclosed circuit breaker 600 can have overall reduced costs at high voltage/current ratings.

As yet another example, the disclosed DC mechanical breaker 600 can operate faster than the mechanisms currently available for mechanical DC breakers 200. The fault current can disrupt faster due to the low-arc operation. In particular, the fault current can start to reduce as soon as the primary switch 612 starts to open since oscillating current initiates in the main circuit 604 with a high initial peak (and not in the primary switch branch 612 with an evolving peak), which can render a rapid current zero-crossing in the secondary switch (AC circuit breaker) 609.

In addition, neither a commutating inductor nor a surge arrestor (energy absorber) may be necessary in the disclosed circuit breaker 600. Indeed, unlike in conventional mechanical breakers 200, fault energy can be dissipated through the same RC circuit 619 by reclosing the primary switch 612, which can obviate the need for a separate energy absorber through a nonlinear resistor.

Figure 7:
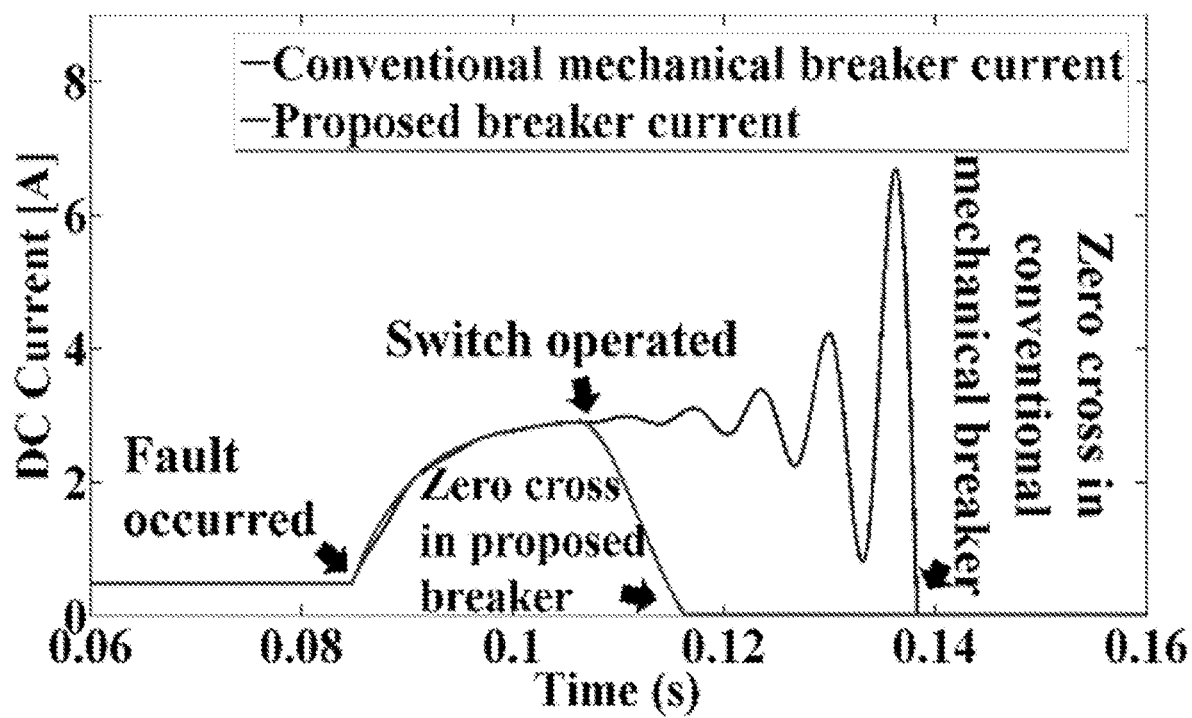
FIG. 7 illustrates an example of a creation of a current zero-crossing in the disclosed DC mechanical circuit breaker, in accordance with various embodiments of the present disclosure.

Next, the mathematical model for the disclosed mechanical DC circuit breaker will be described. From FIG. 7, one has the current and voltage relationships during the interruption process as $$I_b = I_{main} - I_2 \qquad (1)$$

and $$RI_c + V_c = U_{arc} \qquad (2)$$

where $I_{main}$ is the main current to be interrupted, $I_b$ is the current through the primary switch, and $I_c$ is the current through the parallel capacitor. In addition, R is the restraining resistance in series with the capacitor, $V_c$ is the capacitor voltage, and $U_{arc}$ is the arc voltage that is the voltage across the primary switch during the current interruption. The voltage across the primary switch $U_{arc}$ can depend on arc resistance. Finally, $V_s$ is the supply DC voltage, L is the inductance of the line smoothing reactor, and $R_L$ is the equivalent main path resistance in FIG. 6. One should note that under short circuit $R_L$ is the series combination of line and fault resistances.

Next, scenarios with DC circuit breakers 600 using two differently-sized capacitors will be examined. In the case where a large capacitor is used, or disrupted voltage/current is low, a sustained arc may not be established. Due to the fast transients of the current commutation, the current can be rapidly transferred to the capacitor branch once the breaker starts to operate. Thus, in calculating the main current oscillations and zero-crossing, at low restraining resistance in the secondary breaker/RC circuit, the commutation time is considered negligible (see FIGS. 8C and 8D for example). By applying KVL through the main circuit, one has $$L\frac{dI_{main}}{dt} + U_{arc} + I_{main}R_L = V_S \tag{3}$$

where Vs is the source voltage. Simplifying equation (3), $$L\frac{d^2 I_{main}}{dt^2} + (R+R_L)\frac{dI_{main}}{dt} + I_b R_L = V_S \tag{4}$$

By applying KVL during current interruption, one has $$\frac{d^2 I_{main}}{dt^2} + \frac{R+R_L}{L}\frac{dI_{main}}{dt} + \frac{I_{main}}{LC} = 0. \tag{5}$$

To have an underdamped response for the main current, one can have $$\frac{R+R_L}{L} \leq \sqrt{\frac{1}{LC}}$$

that yields $$C \leq \frac{L}{(R+R_L)^2}.$$

Significantly small capacitance values may lead to undesirable arc extinction in the primary switch and must be avoided. In addition, under large line resistance, an overdamped line current results as opposed to an underdamped oscillation.

Solving equation (5) yields the current decay solution as $$I_{main}(t) = k_1 \cos(\omega_d t + \varphi)e^{-\alpha t} \tag{6}$$

where $$\alpha = \frac{R+R_L}{2L}, \omega_d = \sqrt{\omega_0^2 - \alpha^2}, \text{ and } \omega_0 = \sqrt{\frac{1}{LC}}.$$

The initial conditions are used to calculate $\varphi$ and $k_1$ as $$\varphi = \arctan\left(\frac{V_s - V_C(0)}{I_f \omega_d (R+R_L)} - \frac{1}{\omega_d}\right) \tag{7}$$

and $$k_1 = \frac{I_f}{\cos\varphi} \tag{8}$$

where $I_f = I_{main}(0)$ is the fault current and $V_c(0)$ is the capacitor voltage at the end of commutation time, which is significantly smaller than fault current termination time, and thus, the commutation time is assumed zero here. Next, equation (6) along with $I_{main}(t)=0$ is used to find fault current termination time $T_f$ using $\cos(\omega_d T_f + \varphi)=0$. It is noted that larger capacitance values can result in increased fault current termination time $T_f$.

C is the capacitor value parallel to the mechanical switch. Now KVL through the breaker-capacitor-resistor loop results as $$\left(R + \frac{dU_{arc}}{dI_b}\right)\frac{dI_b}{dt} + \frac{I_b}{C} = \frac{I_{main}}{C} + R\frac{dI_{main}}{dt}. \tag{9}$$

Second, in the scenario where a small capacitor is used, or disrupted voltage/current is high, an arc is established between switch contacts. Once the arc is generated its impedance remains almost constant and at low values over time, preventing the commutation of current into the capacitor as easily. In this case, the parasitic inductance of the RC branch 619 can generate an oscillating current, which can lead to current zero-crossing at the switch contacts, similar to high-voltage breakers. Thus, available LC commutation analysis can be conducted for this case and is skipped here.

Figure 11A:
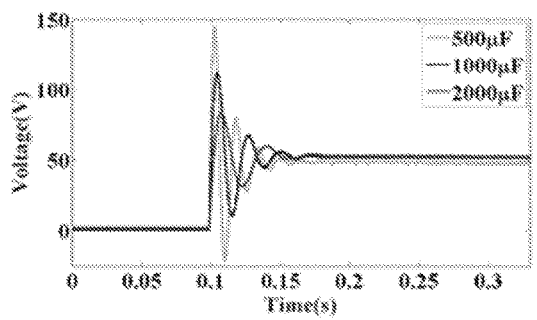
FIGS. 11A-D illustrate examples of the effect of capacitor size and other switch currents in the disclosed DC mechanical circuit breaker, in accordance with various embodiments of the present disclosure
Figure 11B:
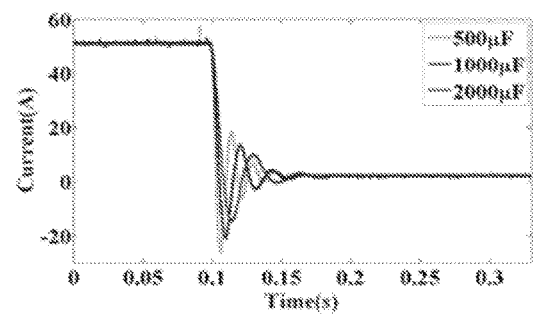
Figure 11C:
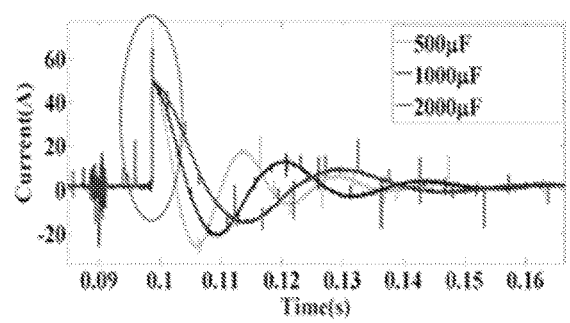
Figure 11D:
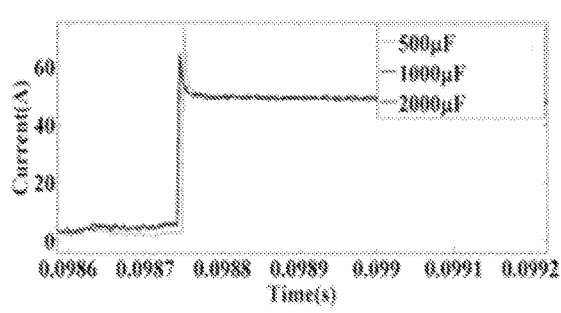

For the case that uses a large capacitor, when the current through the breaker 612 is zero, the main current can commutate to the parallel capacitor branch 619. Thus, the time to open breaker contacts $T_s$, which affects the capacitor voltage $V_c(0)$ in (5), is the time between when the switch starts to operate after sending triggering pulse and when the current through the switch zero. Time $T_s$ depends on mechanical specifications of the primary switch. During the primary switch operation, the change in the capacitor current from zero to fault current $I_f$ is considered linear for simplicity (see FIGS. 11C and 11D for example). Thus, $V_c$ can be approximated as $$V_c(0) = \frac{1}{C}\int_0^{T_s} \frac{I_f}{T_s} t \cdot dt = \frac{I_f T_s}{2C} \tag{10}$$

with $T_s$ being the switch operation time. From our test results, it is also revealed that by using an appropriate capacitor and restraining resistor sizes, $T_s$ is negligibly small (i.e., $T_s=0$) and thus $V_c(0)=0$.

Finally, experimental results derived from simulations will be described. MATLAB Simulink is used to predict the performance of the inventive mechanism. In addition, hardware setups of different voltage and current level are prepared to evaluate the performance of the disclosed mechanical DC circuit breaker.

Turning to FIGS. 8 and 9, results of low-voltage tests using simulations and an experimental setup will be described. The circuit diagram depicted in FIG. 6 is used for the simulations and experiments. A high-current 10V DC source is used to feed the circuit with a load of 2052 in normal condition. The smoothing reactor is 20 mH with an internal resistance of 0.30 and the commutation circuit comprises a 1 mF capacitor in series with a 1.10 resistor. A line to ground fault with 30 fault impedance is applied to the circuit at the load side. An 110V mechanical DC switch is used as the primary switch 612 and a typical 120V zero-crossing AC switch is used as the AC breaker 609. The results are shown next. Reducing the restraining resistance in the commutation branch can shorten the fault termination time in the expense of higher capacitor currents.

FIGS. 8 and 9 present the disclosed breaker's performance using simulation and hardware tests, respectively. The primary switch 612 used in the hardware experiments has a response time of 20 ms, whereas an ideal switch was used for simulation purposes. In hardware setup, owing to the response time of about 20 ms of the primary mechanical switch 612, the fault current can continue to flow for another 20 ms after detection. In contrast, the primary switch 612 in simulation can open its contacts as soon as the conditions for contact opening meet. FIGS. 8A and 8B depict the primary switch 612 current and the main circuit 604 current, respectively. The initial rise of current occurs until the protection mechanism detects overcurrent fault and commands a trip signal to the primary switch 612. In the simulation test, the primary switch 612 starts to open at around 0.086 s, almost instantly after detection of the fault. Once the primary switch 612 opens, as the current through the switch 612 goes to zero, it can commutate to the parallel capacitor path 619 followed by the RLC circuit underdamped action. During the transition of current from the primary switch 612 to the capacitor branch 619 the main current can remain unchanged. Once the commutation is completed at t 0.087 s, the main current can start to reduce through the underdamped RLC circuit, as shown in FIG. 8B. This action can create a current zero-crossing in the main current that a typical AC breaker can take advantage of to terminate the current as shown in FIG. 8B.

Figure 9A:
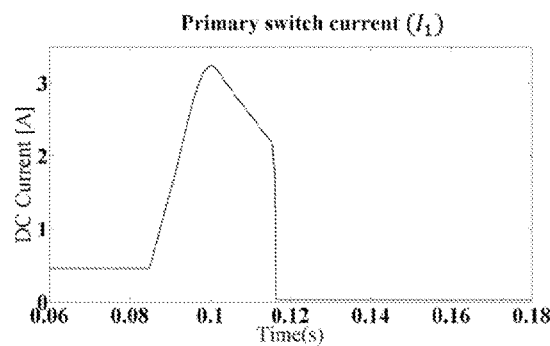
FIGS. 9A-D illustrate examples of the results of hardware tests for evaluating the performance of the disclosed DC mechanical circuit breaker, in accordance with various embodiments of the present disclosure.
Figure 9B:
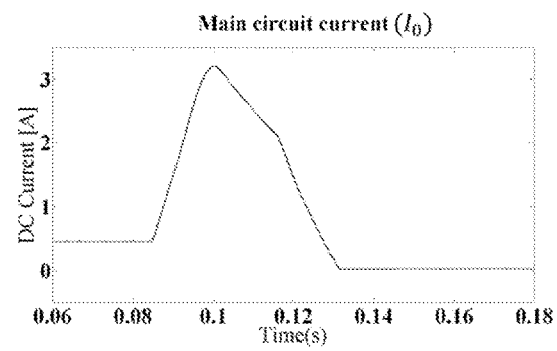

In hardware setup, owing to the response time of about 20 ms of the primary mechanical switch 612, the fault current can continue to flow for another 20 ms after detection. FIGS. 9A and 9B depict the primary switch 612 current and the main circuit 604 current, respectively. Initial the current rises until the protection mechanism detects overcurrent fault and commands a trip signal to the primary switch 612. The protection mechanism comprises main circuit 604 current sensor whose signal is picked up by the dSpace (Model: DS1104) hardware, which in turn sends a trip signal to the primary switch 612. The primary switch 612 starts to open at around 0.105 s, which is almost 20 ms after detection of the fault. Once the primary switch 612 opens, as the current through the switch 612 goes to zero and it commutates to the parallel capacitor path 619 followed by the RLC circuit underdamped action similar to simulation test. Once the commutation of current is completed at t 0.107 s, the main current starts to reduce FIG. 9B. At the first zero-crossing of the main current, a typical AC breaker can terminate the current as shown in FIG. 9B.

Figure 8A:
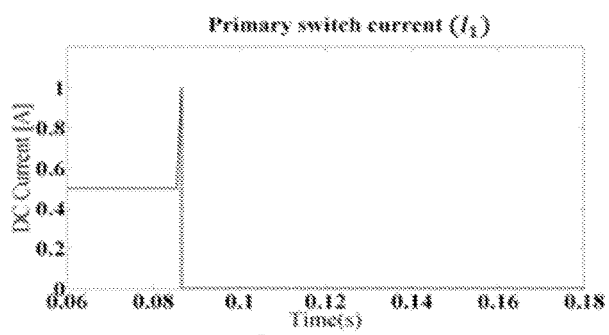
FIGS. 8A-D illustrate examples of the results of simulations for evaluating the performance of the disclosed DC mechanical circuit breaker, in accordance with various embodiments of the present disclosure.
Figure 8B:
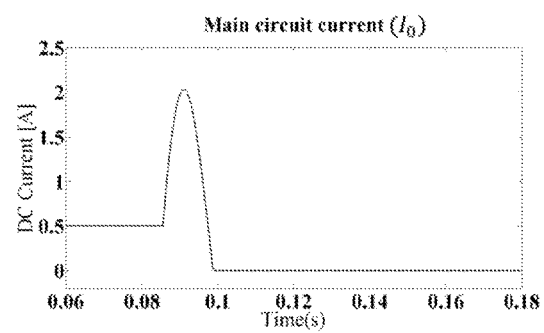
Figure 8C:
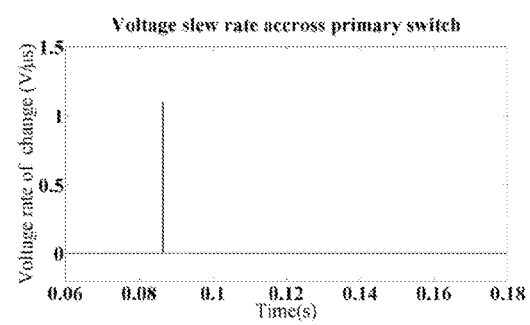
Figure 8D:
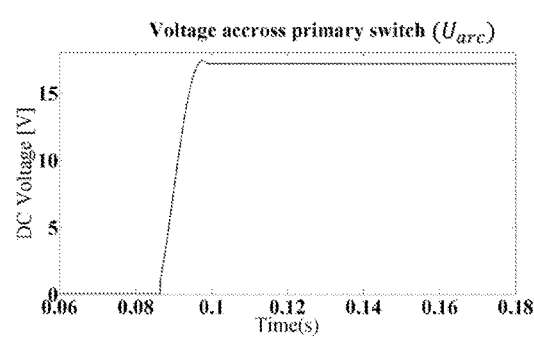
Figure 9C:
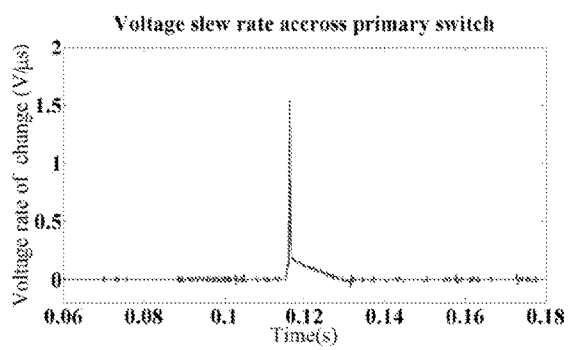
Figure 9D:
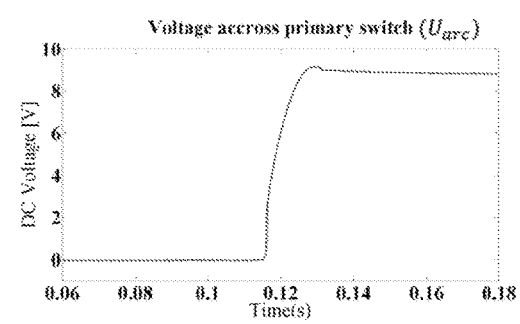

FIG. 8D and FIG. 9D show the voltage across the primary switch 612 in simulation and hardware setups respectively. The measured voltage in hardware is lower than the simulation results due to the voltage sensor input impedance and the AC breaker 609 leakage. If we do not use the AC breaker 609 and let the main current flow, both voltages will settle down around 10 V.

The rate of change in the voltage across the primary switch is shown in FIGS. 8C and 9C. The slew rate is well within the limit of 80 V/I·ts required for long lasting arc. Overall, there is a good match between experimental and simulation results and this low voltage slew rate is an important advantage of the inventive method, resulting in a fast elimination of the arc.

Turning to FIGS. 10-15, described are results for low-voltage tests using an experimental setup will be described. One-ohm resistors are used as loads and a 10 mH, 50A inductor is employed to reflect the line inductance, smoothing reactor, inductive loads. A typical 3 Km-line inductance is around 1 mH. If the inverter has a smoothing/limiting reactor (2 mH or more) or an inductive DC load (such as a DC motor) is used, their inductance values can be added to that of the line leading to a larger inductance. Higher inductance values can make the current disruption more difficult and facilitate the formation of the arc due to a large value of $$L\frac{di}{dt}.$$

In the experiments, a 10 mH inductor is chosen to account for high-inductance paths, which are more difficult to break. Consequently, the test results may be interpreted as worst-case scenarios since large inductance values contribute to a longer zero-crossing time and a higher chance of arc formation.

The commutation circuit is tested with various capacitor and restraining resistor sizes. Here, the AC breaker 609 is bypassed to observe the oscillatory behavior of the after-fault circuit. All voltages are directly measured by an oscilloscope. Currents are measured using oscilloscope through pertinent voltages.

For the simulations, the primary switch 612 is simulated via a time-varying resistor described as $R_s=R_0[1+(t-t_d)^3 u(t-t_d)]$ with $R_0$ being an initial small resistance and $t_d$ the interruption initiation time. When $t_d$ reaches $T_s$ the switch path is almost an open circuit. A 28 Vdc 300 Vac 40 A mechanical DC switch is used as the primary switch 612. The results are shown next.

First, the 28V 40 A breaker 612 is tested for its tolerable limits. At 35V and 33.5 A, the breaker 612 can disrupt current in 80 ms (from the contact separation time) but exhibits a large arc. At 42.8V and 40.0 A, current cannot be disrupted, and an arc sustains. Similarly, at 49.8V and 24.3 A, current cannot be disrupted, and an arc sustains ($V_{arc}=30V$, $I_{arc}\approx 10$ A). Evidently, voltages above the switch rated voltage (28V) significantly increase the possibility of arcing and makes it difficult to disrupt the currents (40 A).

Figure 10:
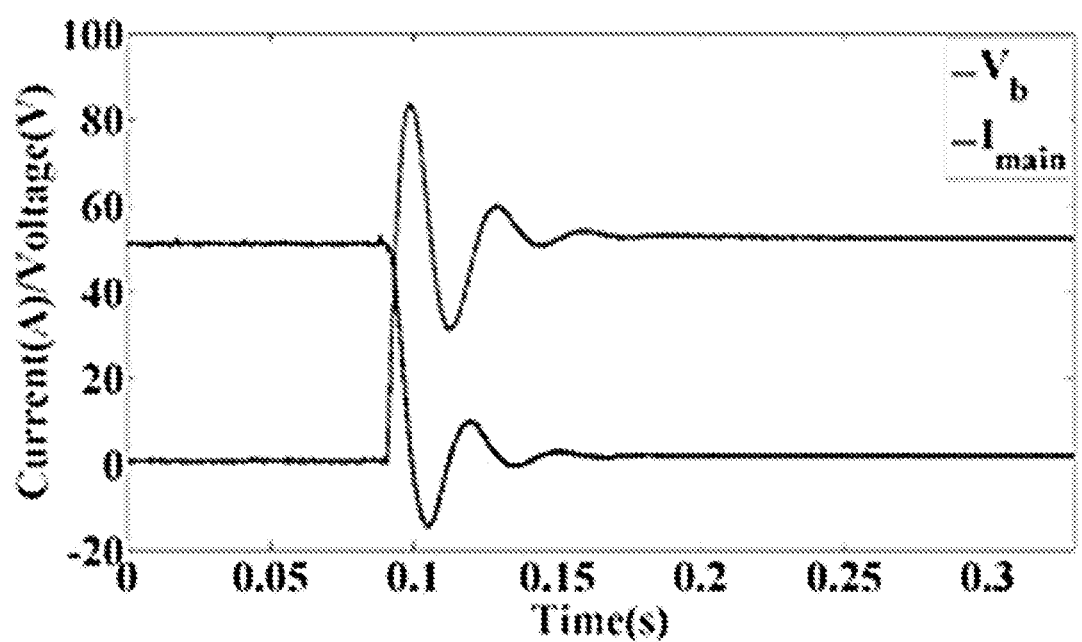
FIG. 10 illustrates an example of the results of a test of the disclosed DC mechanical circuit breaker with an RC commutating circuit, in accordance with various embodiments of the present disclosure.

Next, the DC switch 612 is tested under 53V and 51.3 A with the RC commutating circuit 619 added (C=2000 μF and R=0.05Ω) with the results shown in FIG. 10. Results of FIG. 10 reveal a satisfactory commutation and main current zero-crossing in 8 ms. Unlike in the conventional HVDC mechanical DCCBs, in case of disclosed circuit breaker 600, the underdamped oscillation occurs in the main current.

It is also noted that the RC branch 619 parasitic inductance does not prevent the commutation and no current and voltage waveform distortion is observed indicating possibly only a very small arc. Since the AC switch 609 is bypassed in the test, the main circuit 612 current proceeds to flow in the reverse direction and capacitor voltage settles at 53V. Once AC switch 609 is back in the circuit, the current stops at zero-crossing and capacitor 615 voltage stay at its peak (83.72V).

FIG. 11 depicts the effect of capacitor 615 size and other switch currents. Smaller capacitor 615 sizes decrease the zero-crossing time (3.2 ms with C=500 μF) but increase the capacitor peak voltage. FIGS. 11A and 11B illustrate the capacitor 615 current and voltage during the commutation and after. FIGS. 11C and 11D depict the capacitor voltage and current in the commutation time only. The overshoots at the end of the commutation are due to the localized LC oscillation of the capacitor 615 and its parasitic inductance. Evidently, the commutation time is much less than that of the LC oscillation and thus is ignored in the calculation of the main current zero-crossing.

Figure 12:
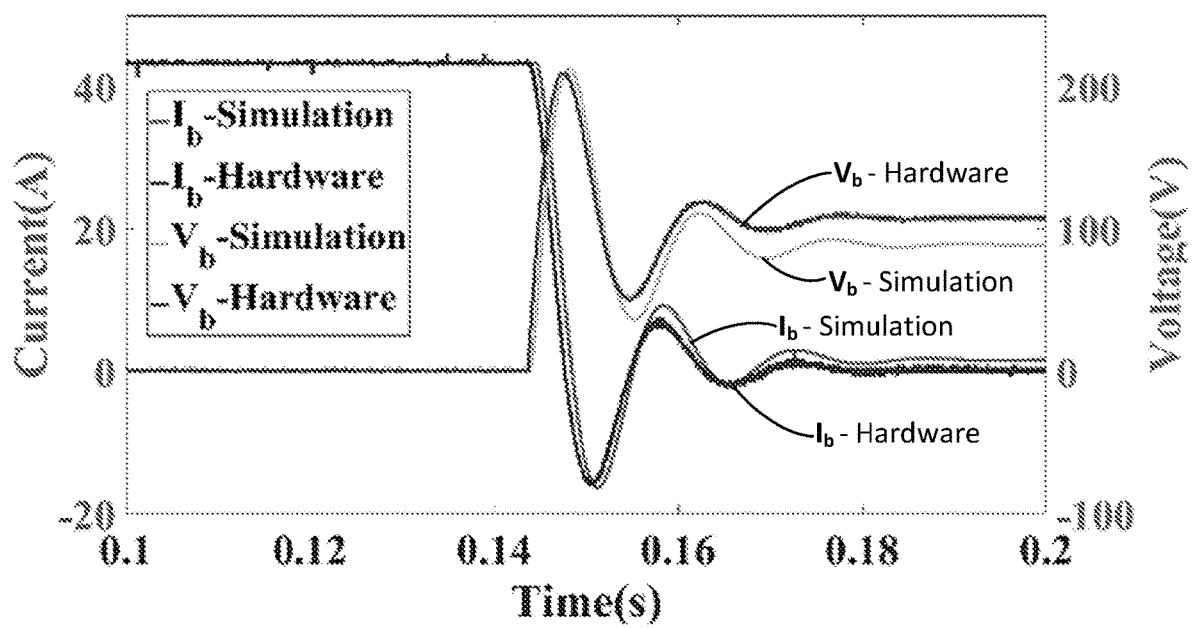
FIG. 12 illustrates an example of a comparison of the results of hardware tests and simulations for the disclosed DC mechanical circuit breaker, in accordance with various embodiments of the present disclosure.

FIG. 12 depicts the primary switch 612 performance under 83V and 43 A with C=500 μF and R=0.05Ω in the commutating branch 619, beyond which the DC supply 603 interrupted due to overloading. Due to a smaller capacitor 615, the main current zero-crossing occurs at 4.4 ms with a peak capacitor voltage of 210V.

FIG. 12 also compares the hardware results with those of simulations using Matlab/Simulink from the breaker voltage and current waveforms. As mentioned earlier the primary switch 612 is not able to extinguish the arc at 49.8V and 24.3 A; i.e., as voltage increases, switch current rating decreases. Thus, this result shows a significant improvement in the original DC switch ratings (almost 3 times the voltage rating of 28V and the same current rating of 40A) and current disruption time (compare with 80 ms at 35V 33.5 A.)

Generally, smaller capacitor 615 sizes decrease the zero-crossing time (4.4 ms with C=500 μF) and increase the capacitor peak voltage. However, the capacitor voltage does not cause any harm to the switch when contacts are separated due to the switch high open-circuit voltage rating (300V ac). Once the AC switch isolates the primary switch from the source, a reclose action at the primary switch discharges the capacitor.

Figure 13:
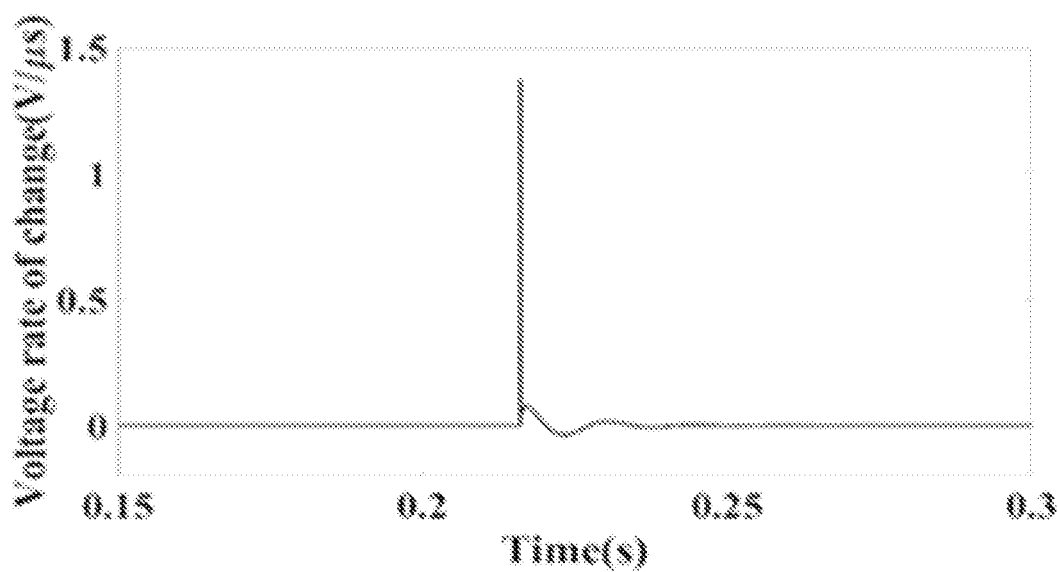
FIG. 13 illustrates an example of the voltage rate of change for the hardware tests and simulations of FIG. 12, in accordance with various embodiments of the present disclosure.

From this test the voltage rate of change does not go very high (1.4 V/μs vs 8 V/μs without RC branch) (FIG. 13). A voltage rate-of-change of less than the 80 V/μs is used for to operate the DC switch safely. The low rate of change in voltage is an important advantage of the disclosed method.

Figure 14:
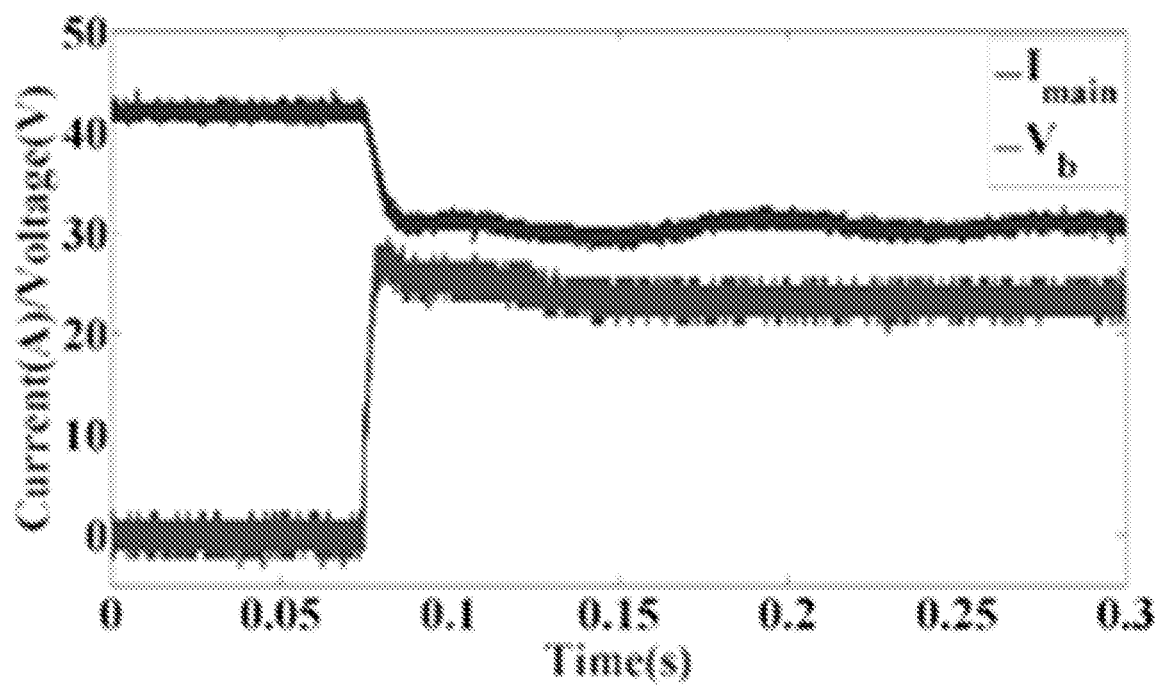
FIG. 14 illustrates an example of a hardware test of the disclosed DC mechanical circuit breaker in which a continuous arc is formed and current cannot be disrupted, in accordance with various embodiments of the present disclosure.
Figure 15:
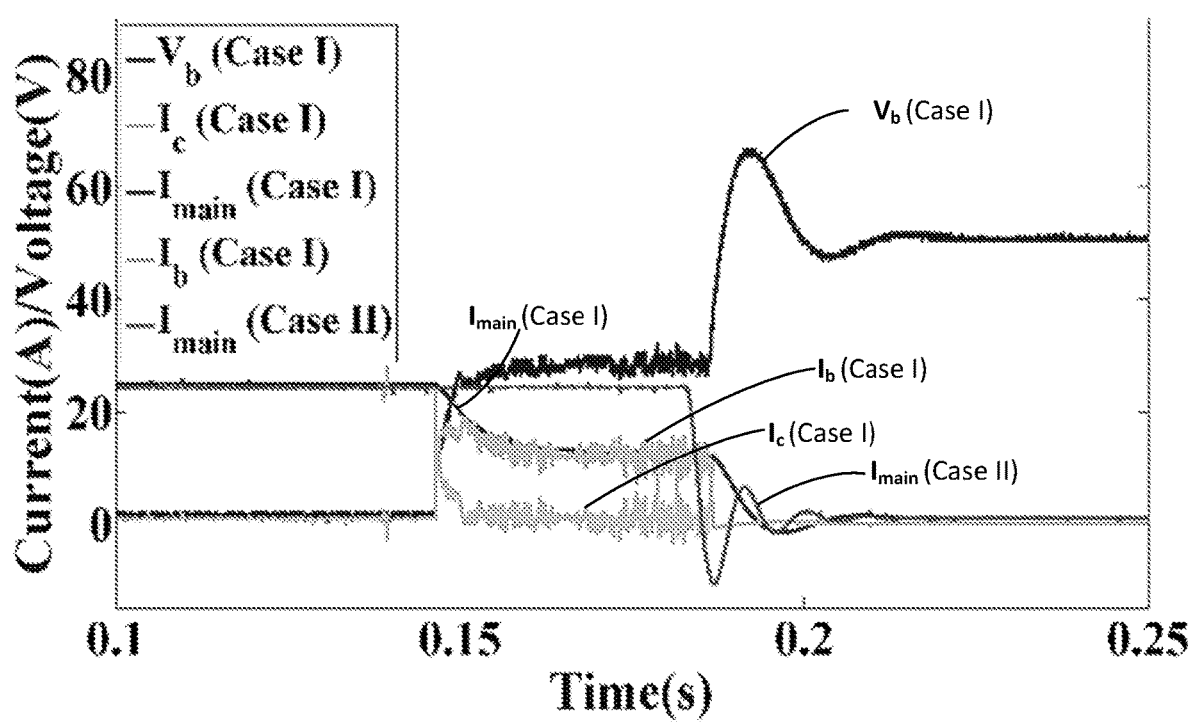
FIG. 15 illustrates an example of the effect of a restraining resistor in tests of the disclosed DC mechanical circuit breaker, in accordance with various embodiments of the present disclosure.

Lastly, the disclosed mechanism is tested at 88V and 43 A using a 209 μF capacitor and 0.05Ω resistor. Continuous arc is formed and current cannot be disrupted as illustrated in FIG. 14. The long chain of series capacitors 615 to provide 209 μF is a contributor to an increased parasitic inductance that led to an initial high voltage rate of change across the primary switch 612.

Next, the effect of the restraining resistor 618 will be examined. Large values of the resistor 618 in the RC branch 619 can make the commutation difficult and can generate a high instantaneous voltage across the breaker that causes an arc to establish between the primary switch 612 contacts. FIG. 14 depicts disrupting a 25 A current at 50V using a 1000 μF capacitor 615 and 0.5Ω resistor 618 in the RC branch 619 and compares the results with that of 209 μF and 0.05Ω. Evidently, even with a much larger capacitor 615, the higher path resistance can cause a significant arc in the primary switch 615 that delays current disruption. Establishment of the arc, however, causes an LC resonance made by the capacitor 615 and its parasitic inductor that can eventually generate a current zero-crossing at the switch 612 contacts at this voltage and current levels.

Figure 16:
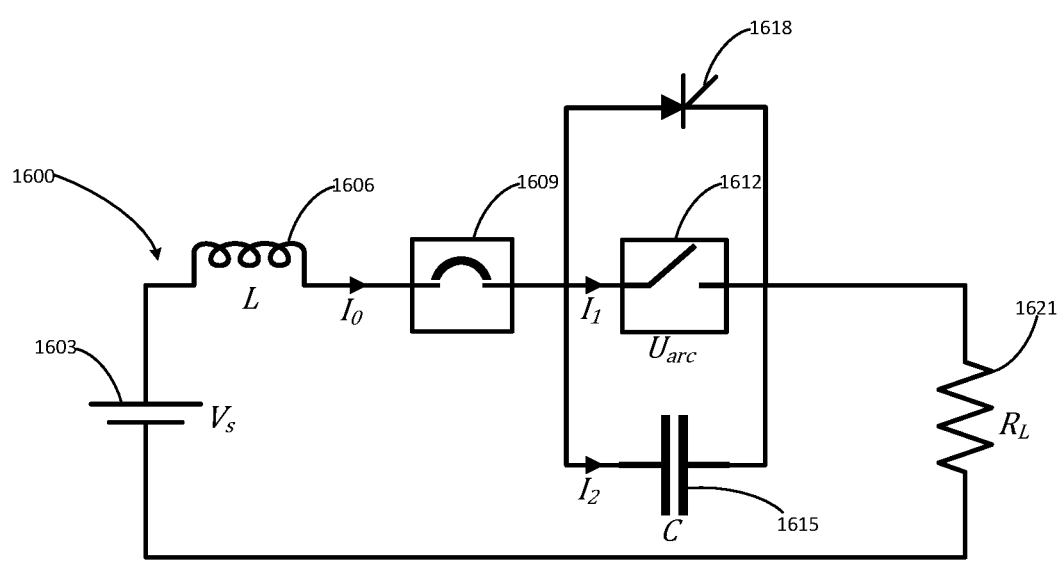
FIG. 16 illustrates an example of a modified DC hybrid circuit breaker with the disclosed DC circuit breaker mechanism, in accordance with various embodiments of the present disclosure.

Turning to FIG. 16, the application of the disclosed method on the hybrid circuit breaker 1600 will now be described. It is anticipated that the larger currents and voltages are disrupted using solid-state (SS) switches 1618 at the cost of higher voltage rate-of-change. Thus, the hybrid circuit breaker 1600 of FIG. 16 is built by using the same primary switch 1712 (28 Vdc, 40 A) and a 600V, 50 A IGBT (Semikron SKM 75GB063D) to test the effectiveness of the disclosed mechanism on reducing the voltage rate of change in the SS switch 1618.

The diagram depicted in FIG. 16 is similar to that used in soft-switching mechanism associated with power electronic switches and creates a zero-voltage switching (ZVS). In normal operation, the current flows through the mechanical primary switch 1612. When current is disrupted, it is redirected to the solid-state switch 1618 followed by opening the SS switch 1618 gate.

Without the RC commutating branch, the voltage spikes to 700V when the SS switch 1612 is turned off at 30V. Higher supply voltages were not tested due to potential hazards. The case with 88V and 43 A using a 209 μF capacitor and 0.05Ω resistor generates a continuous arc when the primary switch 1612 is used with the RC branch but without the SS switch 1618, as explained above.

Figure 17A:
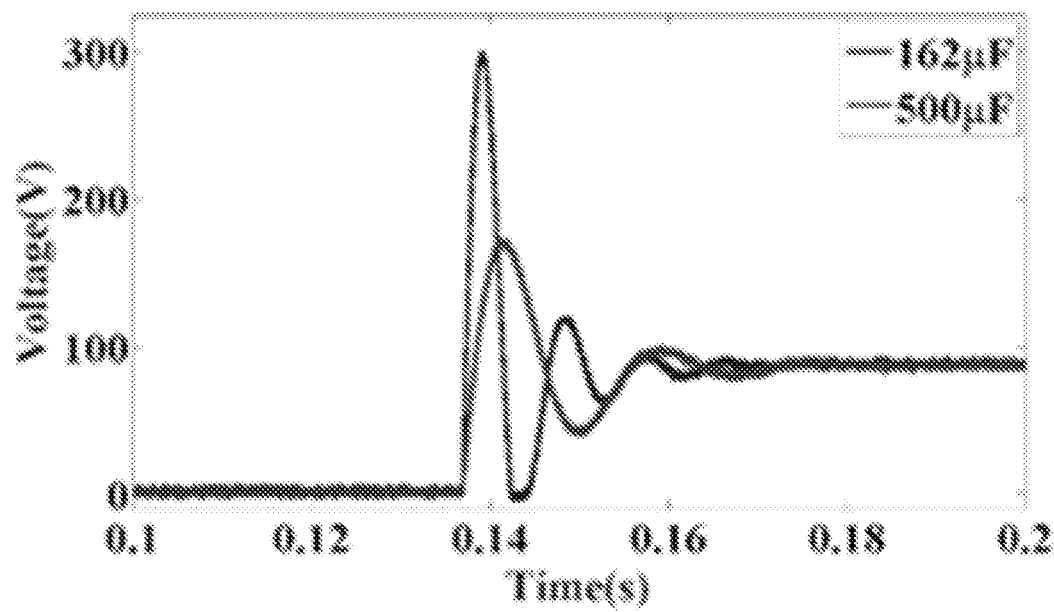
FIGS. 17A-B illustrate examples of the results of a test for evaluating the performance of the disclosed DC hybrid circuit breaker, in accordance with various embodiments of the present disclosure.
Figure 17B:
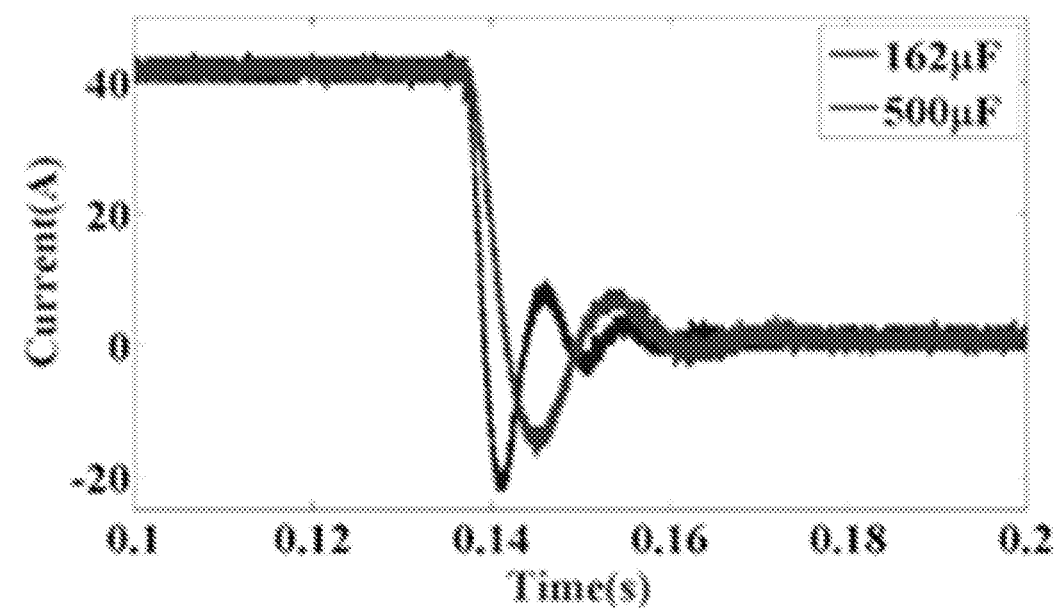

This case is now tested using the hybrid topology 1600 with the results shown in FIG. 17. In this test, two capacitor 1615 sizes are used, 500 μF and 162 μF. Here, the transition from the mechanical switch 1612 to the SS switch 1618 is performed manually and only the SS switch 1618 operation is illustrated. When a 162 μF capacitor 1715 is utilized, the voltage is chopped in the negative region due to the IGBT antiparallel diode. In both cases, the voltage rate of change is much smaller than 80 V/μs rate required for generating a continuous arc in the circuit $$\left(\frac{dv}{dt} = \frac{I_0}{C}\right).$$

The main disadvantage of solid-state breakers 1618 is their steady-state losses. In addition, in hybrid topologies 1600, the static switch 1618 should wait until the mechanical breaker's 1612 contacts separate enough to avoid the chance of reigniting the arc. Under faulted circuits, during this time the fault current can increase by three times the initial fault circuit. By contrast, the disclosed mechanical breaker 600 immediately prevents the increase of current by placing the commutating capacitor 615 in series with the main circuit 604.

FIG. 18 summarizes the test results with the disclosed mechanical breaker 600 and hybrid breaker 1600. All disruption times are calculated using equation (4) and $V_c(0)=0$ and compared with simulation.

In the mechanism of FIG. 16, as well as the mechanism of FIG. 6, the AC breaker 1609 can operate as soon as the main current zero-crossing is detected. At this moment, commutating capacitor voltage is at maximum where the primary circuit 1612 can reclose to absorb the energy stored in the capacitor 1615. Other methods of dissipating the stored energy can use surge arrestors (variable resistors).

In the disclosed topology 1700, if the AC breaker 1609 can let the main current swings settle, the capacitor voltage reduces to that of the DC source 1603 and thus the stored energy can be significantly lower. In this case, the fault energy is sent back to the DC source 1603 in part. The absorb circuit can now operate and remove the remaining stored energy in the capacitor after the AC breaker 1609 operates. Note that this operation increases the fault disruption time. The fault current, however, is also reduced significantly after the first swing.

In the disclosed mechanisms, the mechanical breaker 1612 or the solid-state switch 1618 does not absorb the disruption/fault energy. The short-circuit/disruption energy is stored in the commutating capacitor. The capacitor peak voltage in each scenario represents the fault/disruption energy $$\left(E_f = \frac{1}{2}CV_C^2\right).$$

Figure 19:
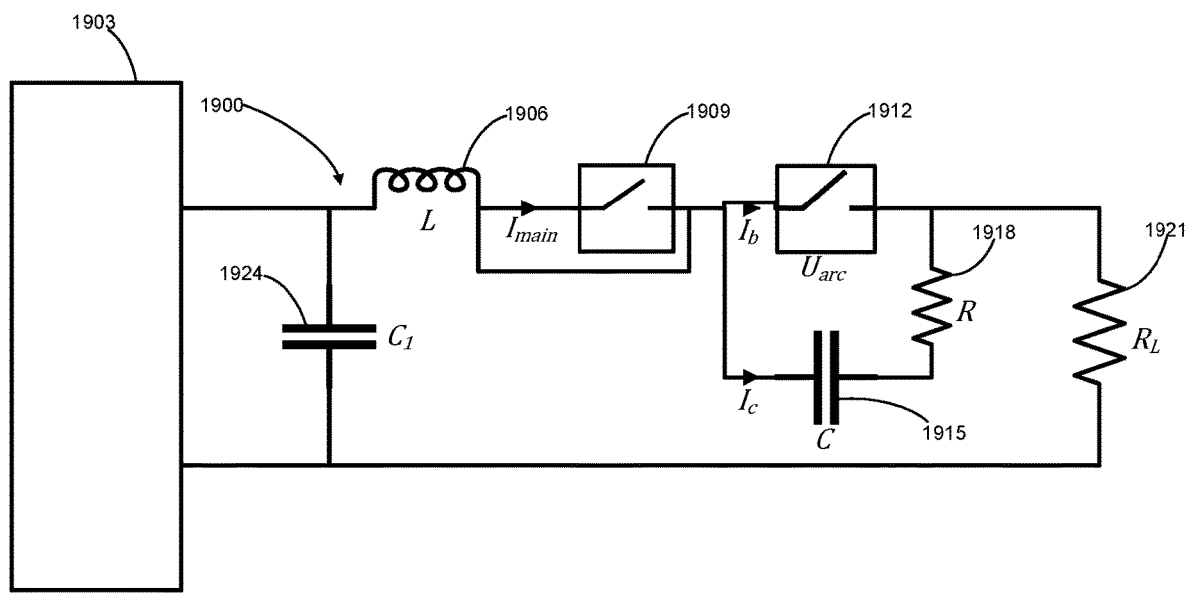
FIG. 19 illustrates an example of a circuit used for high voltage tests of the disclosed DC mechanical circuit breaker, in accordance with various embodiments of the present disclosure.
Figure 20A:
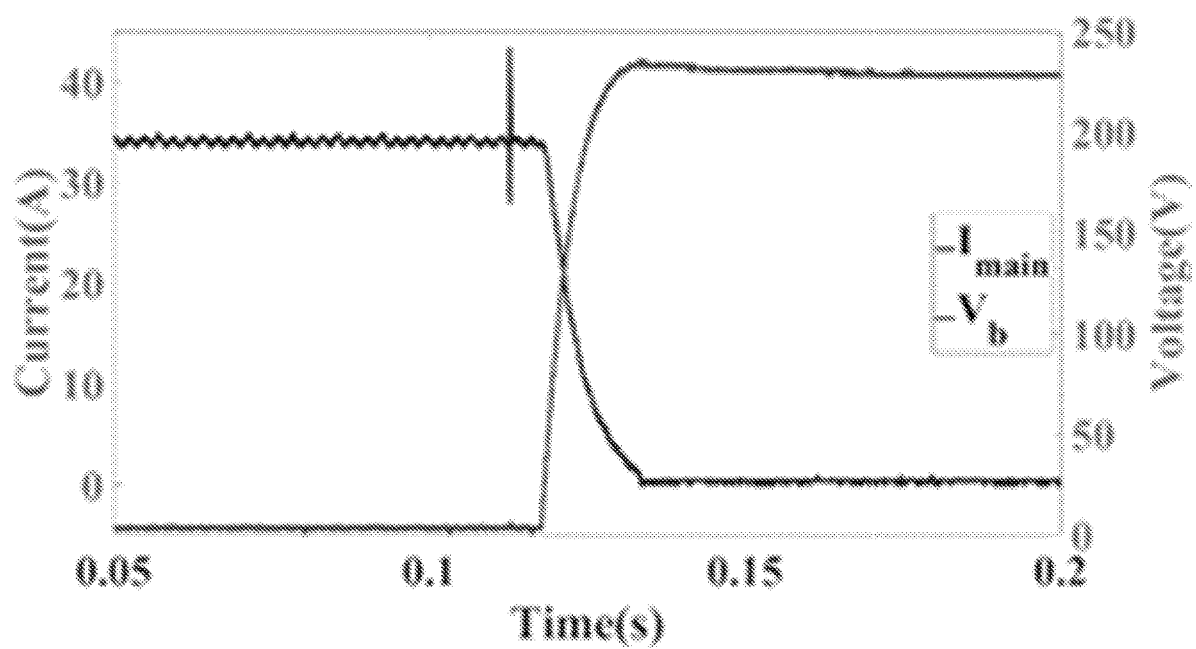
FIGS. 20A-B illustrate examples of the results of high-voltage tests of the disclosed DC mechanical circuit breaker, in accordance with various embodiments of the present disclosure.
Figure 20B:
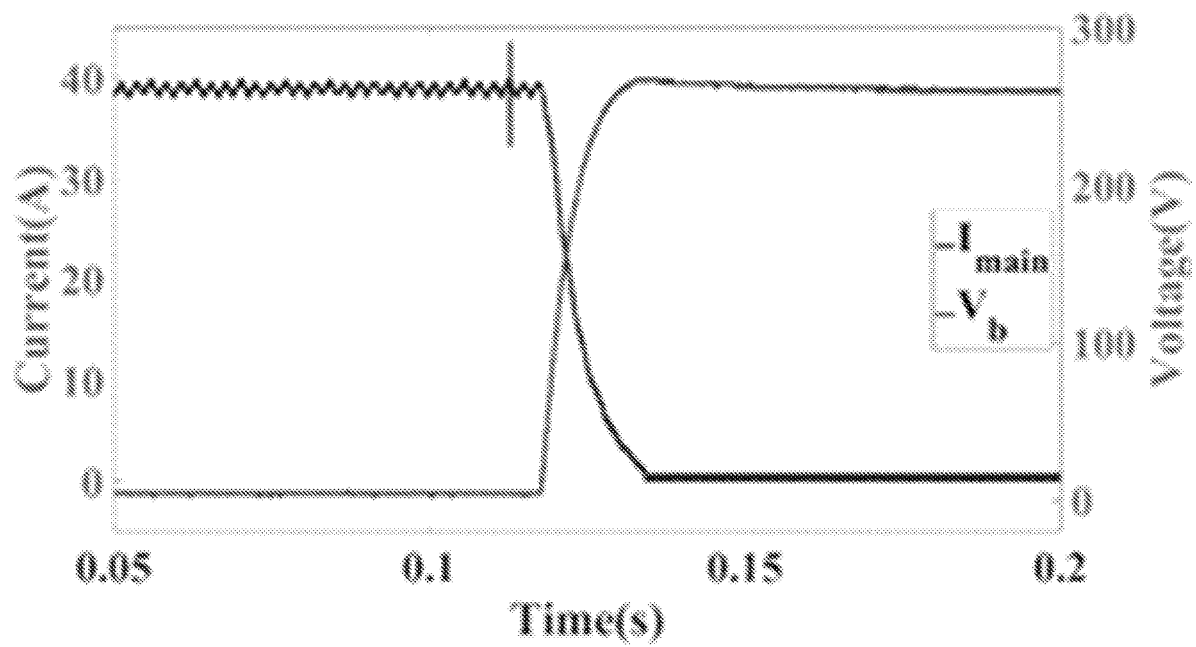
Figure 21:
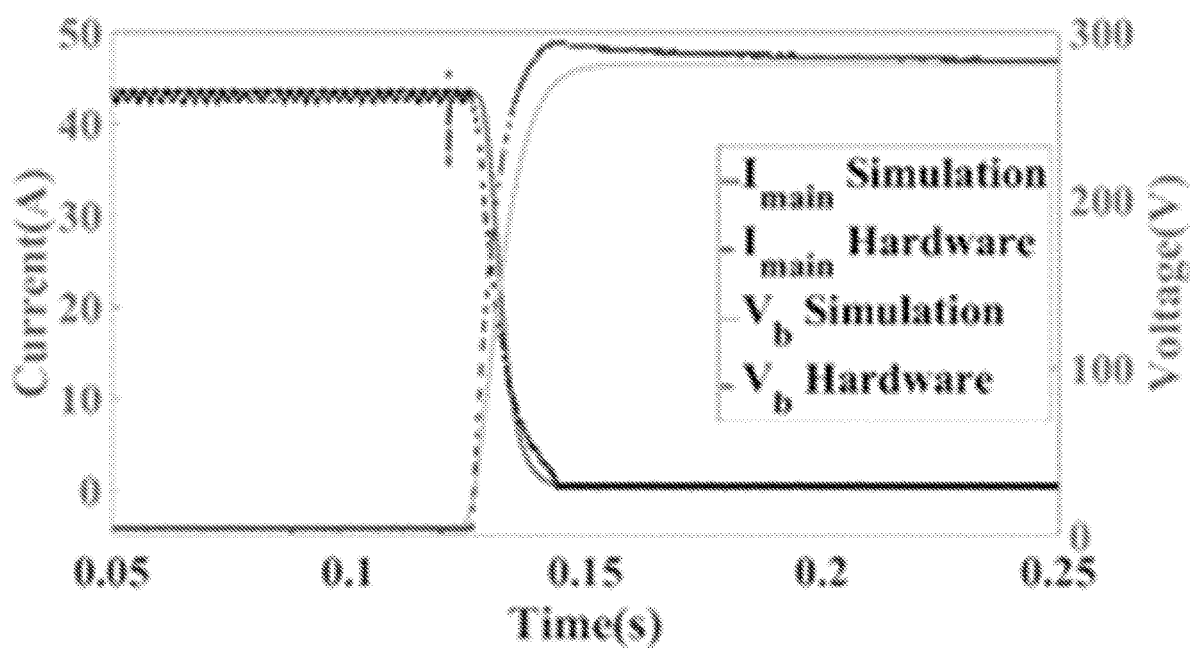
FIG. 21 illustrates an example of a comparison of the results of high-voltage hardware tests and simulations for the disclosed DC mechanical circuit breaker, in accordance with various embodiments of the present disclosure.

Turning to FIGS. 19-21, results with higher voltages will be examined. A separate DC power supply 23 is built (FIG. 19) to test the disclosed mechanical breaker under higher voltages. The same mechanical breaker (28 Vdc 300 Vac 40 A) is used for both primary 2409 and AC switches 2406. The restraining resistor is the commutation path resistance and the capacitor ESR. The commutation capacitance and the series inductance are kept constant at 1000 µF and 10 mH, respectively. All the observations are measured by an oscilloscope. in oscilloscope and then plotted.

FIG. 20B shows the test results under 227V and 35 A. From the figure, the current is disrupted in 15 ms. This test represents a high-impedance fault clearance where a 6.5 Ohm resistance is in series with the breaker and power supply. The current spike caught on the plot represents the initiation of signal to the breakers, and it takes some time for the breaker coil to operate. Subsequently, FIGS. 20B and 21 illustrate the test under 260V 40 A and 283V 43.5 A conditions. Due to the similar RLC circuit, the disruption time stays at 15 ms. Note that due to the high resistance of the circuit, an overdamped current results, leading to a longer disruption time. Faster disruption times requires smaller commutating capacitance and thus a higher rating mechanical breaker that operates faster.

The 283V 43.5 A case is also simulated in Matlab/Simulink and the results are shown in FIG. 21. FIG. 21 indicates a satisfactory approximation of the current. The voltage from the hardware tests has a small overshoot. In all these results the primary breaker 2309 disrupts with no visible arc unlike when not using the disclosed mechanism 2300 where a continuous arc forms.

Figure 22:
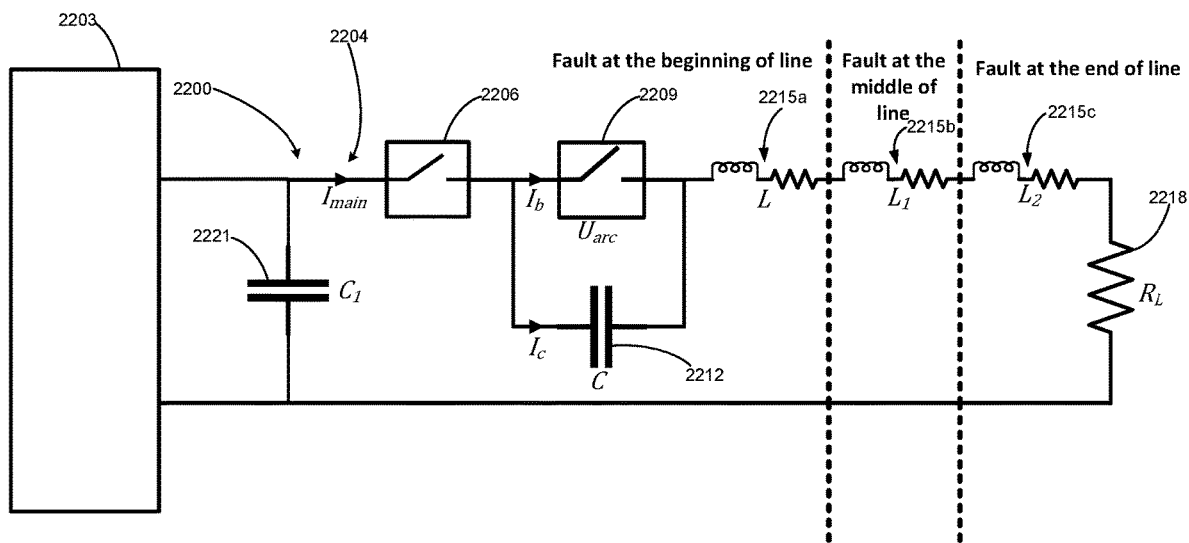
FIG. 22 illustrates an example of a circuit used for high tests of the disclosed DC mechanical circuit breaker in a distribution line, in accordance with various embodiments of the present disclosure.

Turning to FIGS. 22 and 23, simulations were also carried out to determine the operation of the disclosed breaker in a distribution line. MATLAB/Simulink is used to simulate the DC circuit shown in FIG. 22. A three-phase rectifier 2303 is used to generate a 13.8 KV DC voltage with a nominal current of 2000 A. A 10 km-long DC line with an inductance of 1 mH per 3 km with a total inductance of 3.33 mH and resistance of 33 m Ω was considered for the entire cable. The commutation capacitance is 1000 µF and restraining resistance is set to zero. Short circuit faults are applied at different parts of the circuit and current disruption through the disclosed mechanism is observed.

Figure 23A:
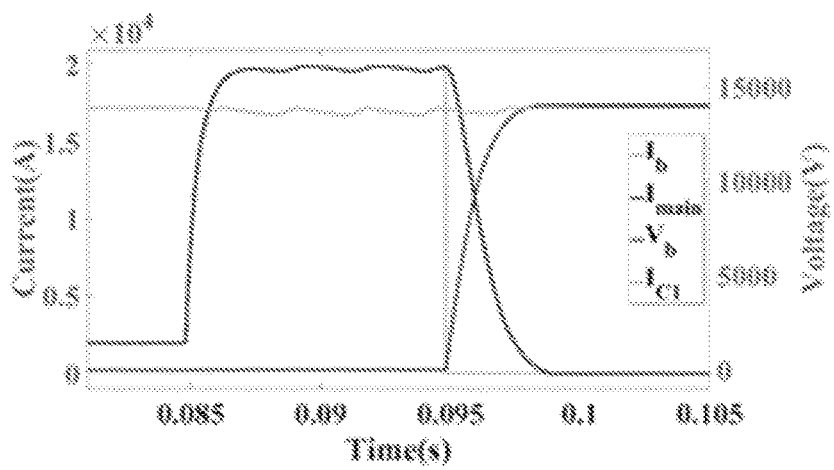
FIGS. 23A-C illustrate examples of the results of simulations to evaluate the performance of the disclosed DC mechanical circuit breaker in a distribution line, in accordance with various embodiments of the present disclosure.

A short circuit fault is applied at the beginning of the line around 1 km from the source. The results are shown in FIG. 23A. The primary switch 2309 response time is set to 10 ms. As the breaker 2309 opens, the current commutation can start and the main circuit 2404 current can begin to oscillate until the current zero-crossing occurs. The disruption time in this case is 3 ms.

Figure 23B:
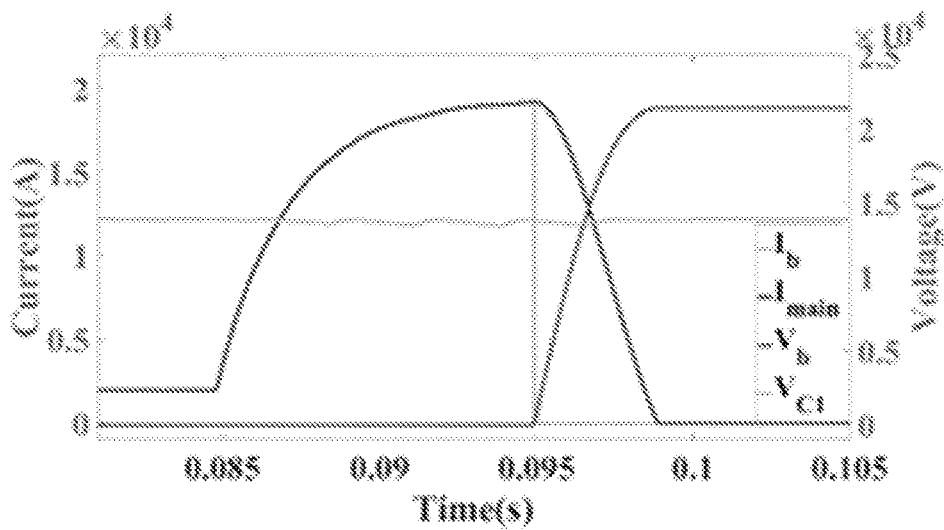
Figure 23C:
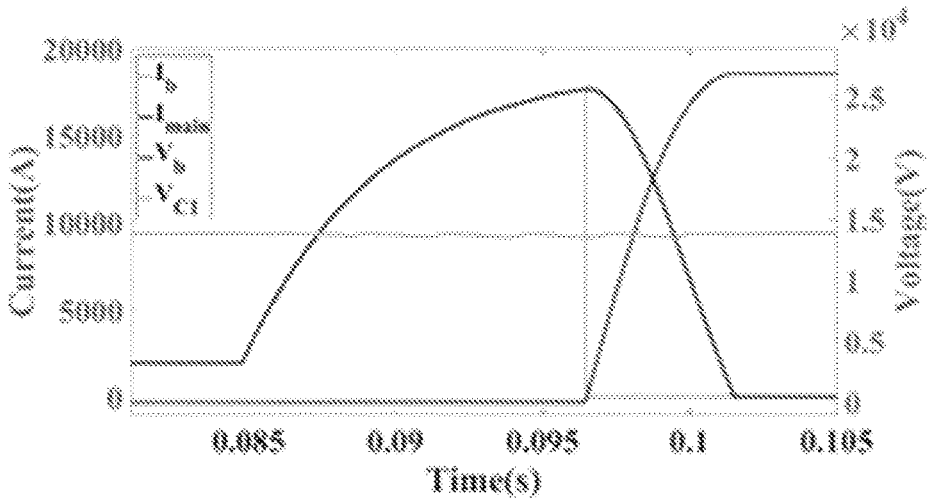

Because the fault occurs at the beginning of the line, the effective line inductance during fault is very low. Thus, fault current and the voltage ripple across the rectifier capacitor 2321 is high. It is also noted that a fast mechanical breaker 2309 is needed to prevent the high fault current and commutation voltage. When the fault is at the middle or end of the line the effective line inductance increases. Due to a higher inductance value, the rate of rise of current along with rectifier capacitor voltage ripple is lowered and the peak fault current is reduced, as shown in FIGS. 23B and 23C. And due to higher impedances, the fault clearing time also increases to 4 ms and 6 ms for faults in the middle and end of line, respectively.

A survey of different DC circuit breakers is given in this disclosure and alternate mechanical and hybrid circuit breakers are introduced that overcome several shortcomings in the available DC breaker technologies. In mechanical circuit breakers, a current zero-crossing should be created for safe fault disruption and to prevent arc between the breaker contacts. In static and hybrid circuit breakers, on the other hand, the static switches are turned off to clear the fault. As a result, a very high voltage appears across the static switch. In high voltage lines, the voltage can go up to a few megavolts. Hence, the static switches and other circuit components must withstand high voltage without breaking down even for low voltage circuits.

The DC circuit breaker described herein has a simpler structure than the available mechanical DCCBs through removing the commutation inductor and nonlinear energy absorber. Instead, a conventional AC circuit breaker is utilized. The disclosed mechanism generates a current zero-crossing and interruption using a primary DC switch and a low-cost AC switch through a simple RC commutation branch and thus can generate current disruption with minimal arc. The disclosed mechanism can effectively increase the ratings of existing DC circuit breakers without having to change the mechanical components and extends the lifetime of those components lifetime.

Simulation and hardware tests show that the rate of rise of voltage is maintained at low levels, unlike in static DCCBs. The capacitor can clamp the voltage that occurs during the fault within the permissible limits. Therefore, the ratings of the primary mechanical switch as well as other components is maintained lower than that of static or hybrid technology. And since the rate of change of voltage is low in the mechanism, the disclosed breaker can be used in high current/voltage applications.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. A direct current (DC) circuit breaker for creating a forced zero-crossing current, the DC circuit breaker comprising:
an alternating current (AC) circuit breaker; and
an alternating commutating circuit connected in series with the AC circuit breaker, the alternating commutating circuit comprising:
a mechanical switch, the mechanical switch comprising a first terminal and a second terminal, the first terminal of the mechanical switch connected to the AC circuit breaker; and
a parallel capacitor connected between the first terminal and the second terminal of the mechanical switch,
wherein the mechanical switch is configured to open in response to detection of a fault current thereby creating a zero-crossing of the fault current and close in response to disruption of the fault current by the AC circuit breaker.

2. The DC circuit breaker of claim 1, further comprising a line smoothing reactor.

3. The DC circuit breaker of claim 2, wherein the parallel capacitor and the line smoothing reactor constitute an LC oscillatory circuit which causes a rapid fault current decay in a main circuit leading to the zero-crossing.

4. The DC circuit breaker of claim 1, wherein the alternating commutating circuit comprises a resistor in series with the parallel capacitor, the resistor and parallel capacitor connected between the first terminal and the second terminal of the mechanical switch.

5. The DC circuit breaker of claim 1, wherein the alternating commutating circuit is connected to a load side of the AC circuit breaker.

6. The DC circuit breaker of claim 1, wherein the mechanical switch is opened in response to an interrupt command or trip signal associated with the detection of the fault current.

7. An apparatus, comprising:
a primary mechanical switch;
an LC branch parallel to the primary mechanical switch; and
a secondary alternating current (AC) circuit breaker in a main circuit, the secondary AC circuit breaker connected in series with the primary mechanical switch;
where the primary mechanical switch is configured to open in response to detection of a fault current thereby creating a zero-crossing of the fault current and close in response to disruption of the fault current by the secondary AC circuit breaker.

8. The apparatus of claim 7, wherein opening the primary mechanical switch comprises initiating a separation of contacts of the primary mechanical switch.

9. The apparatus of claim 7, wherein the LC branch is configured to generate an oscillatory current that causes a decay in a fault current in response to a commutation of the fault current to the LC branch.

10. The apparatus of claim 7, wherein the LC branch comprises a parallel capacitor and a parasitic inductance.

11. The apparatus of claim 10, wherein the parallel capacitor is configured to cause a reduction in a fault current through the primary mechanical switch.

12. The apparatus of claim 10, wherein the LC branch comprises a resistor in series with the parallel capacitor.

13. The apparatus of claim 7, further comprising a solid-state switch in parallel with the primary mechanical switch and a parallel capacitor of the LC branch.

14. The apparatus of claim 13, wherein the solid-state switch is configured to receive a fault current that is redirected from the primary mechanical switch.

15. The apparatus of claim 7, wherein the primary mechanical switch is connected to a load side of the secondary AC circuit breaker.

16. The apparatus of claim 7, wherein the primary mechanical switch is opened in response to an interrupt command or trip signal associated with the detection of the fault current.

* * * * *